(12) United States Patent
Olmen et al.

(10) Patent No.: US 7,611,986 B2
(45) Date of Patent: Nov. 3, 2009

(54) DUAL DAMASCENE PATTERNING METHOD

(75) Inventors: Jan Van Olmen, Boutersem (BE);
Marleen Van Hove, Blanden (BE);
Herbert Struyf, Kontich (BE); Dirk Hendrickx, Sint-Agatha Rode (BE);
Serge Vanhaelemeersch, Leuven (BE);
Werner Boullart, Binkom (BE)

(73) Assignee: IMEC, Leuven (BE)

( * ) Notice: Subject to any disclaimer, the term of this patent is extended or adjusted under 35 U.S.C. 154(b) by 384 days.

(21) Appl. No.: 11/400,852

(22) Filed: Apr. 10, 2006

(65) Prior Publication Data

US 2006/0264033 A1   Nov. 23, 2006

Related U.S. Application Data

(60) Provisional application No. 60/669,973, filed on Apr. 11, 2005.

(30) Foreign Application Priority Data

Jul. 8, 2005   (EP) .................................. 05447167

(51) Int. Cl.
*H01L 21/4763*   (2006.01)
(52) U.S. Cl. ...................... 438/637; 438/618; 438/623; 438/672; 438/675; 257/E21.579

(58) Field of Classification Search .................. 438/597, 438/598, 618, 622–639, 687, 689–710; 257/751–753, 257/758–760, 774, E21.579
See application file for complete search history.

(56) References Cited

U.S. PATENT DOCUMENTS

| | | | |
|---|---|---|---|
| 6,147,009 | A | 11/2000 | Grill et al. |
| 6,455,409 | B1 * | 9/2002 | Subramanian et al. ....... 438/618 |
| 6,645,864 | B1 | 11/2003 | Lin et al. |
| 6,713,386 | B1 | 3/2004 | Hu et al. |
| 7,030,031 | B2 * | 4/2006 | Wille et al. .................. 438/725 |
| 2002/0081855 | A1 | 6/2002 | Jiang et al. |
| 2003/0129842 | A1 * | 7/2003 | Wang et al. .................. 438/694 |
| 2004/0087164 | A1 * | 5/2004 | Bao et al. .................... 438/694 |
| 2004/0127016 | A1 | 7/2004 | Hoog et al. |
| 2004/0175933 | A1 * | 9/2004 | Shishida et al. ............. 438/637 |
| 2004/0266201 | A1 | 12/2004 | Wille et al. |
| 2005/0266691 | A1 * | 12/2005 | Gu et al. ...................... 438/706 |
| 2006/0030159 | A1 * | 2/2006 | Su et al. ...................... 438/700 |

* cited by examiner

*Primary Examiner*—Ha Tran T Nguyen
*Assistant Examiner*—Daniel Whalen
(74) *Attorney, Agent, or Firm*—Knobbe Martens Olson & Bear LLP

(57) ABSTRACT

A method for patterning a dual damascene structure in a semiconductor substrate is disclosed. The patterning is a metal hardmask based pattering eliminating at least resist poisoning and further avoiding or at least minimizing low-k damage. The method can be used as a full-via-first patterning method or a partial-via-first patterning method.

25 Claims, 25 Drawing Sheets

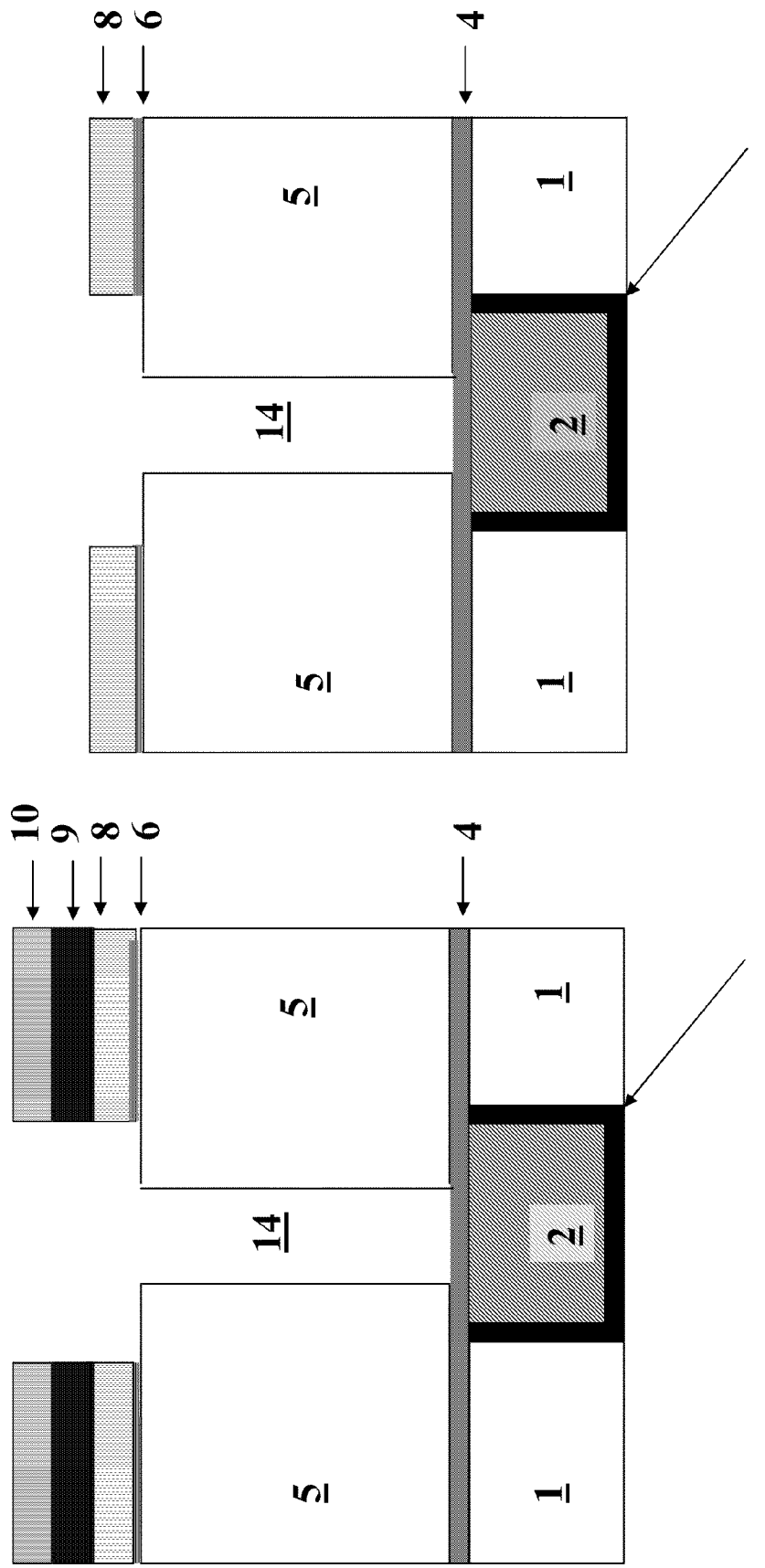

DUAL DAMASCENE PATTERNING METHOD

RELATED APPLICATION

This application claims the benefit of U.S. Provisional Application No. 60/669,973, filed Apr. 11, 2005. The above-referenced prior application is incorporated by reference herein in its entirety and is hereby made a portion of this specification.

FIELD OF INVENTION

The present invention is related to the field of patterning dual damascene interconnect structures. The present invention is further characterized in eliminating photoresist poisoning and avoiding, or at least minimizing, low-k damage during patterning.

BACKGROUND OF THE INVENTION

The semiconductor industry is continuously reducing the dimensions of the devices. In Back End Of Line (BEOL) processing it concerns the reducing dimensions of conductive layers as well as the separation of the different conductive structures to each other. Lowering the capacitance in between these structures becomes extremely important and low-k materials replace conventional dielectric insulating materials. The use of these (porous) low-k materials as dielectric materials in interconnect structures brings new issues to the semiconductor processing. Examples of these issues include photoresist poisoning and low-k damage due to etch, ash and/or clean processes.

Photoresist poisoning is a particular problem when 248 nm (DUV) or 193 nm (ArF) wavelength photoresists are used in conjunction with porous low-k materials. The presence of traces of base nitrogen containing compounds such as amines may neutralize the acids generated upon exposure of 248 nm or 193 nm photoresist and thus inhibiting the chemically amplified acid reaction what is referred to as photoresist poisoning. The altered photoresist material may not be lithographically patterned as expected and result in imprecisely formed features in the photoresist material or excessive photoresist residue remaining on the substrate surface after photoresist development, both of which can detrimentally affect subsequent processes, such as etching processes.

Amines, may originate directly from deposited materials adjacent to the resist layer. Amines can also contaminate indirectly the resist material, such as by diffusion through one or more layers, outgassing of materials during processing steps (such as annealing and plasma treatment) and by etching processes which may expose underlying nitrogen containing layers (such as silicon nitride etch stop layers) to any subsequently deposited resist materials.

Other materials that may also result in resist poisoning include base compounds containing hydroxyl groups.

With the via-first approach for dual damascene patterning, the use of photoresist layers on dielectric layers often results in "poisoning" of the line imaging resist which is done after vias are fully or partially etched into the dielectric.

The poisoning is probably due to absorption and/or generation and liberation of amine compounds from the insulator, as a result of its finite permeability and the use of $N_2$ and $H_2$ process gases in the films below, as well as in the etching and stripping of patterns prior to applying the photoresist where the poisoning is observed. The poisoning problem appears to be much worse when the dielectric layer is a porous low-k insulator applied using chemical vapor deposition (CVD), as compared to silicate glass dielectric layers. This is thought to be a result of the increased permeability of low-k insulators, the use of $N_2O$ as a carrier gas in some deposition recipes, and the common use of reducing chemistries such as $N_2$ and $H_2$ for stripping prior lithographic patterns.

Another important issue in integrating low-k dielectrics is the plasma damage caused by etching, stripping and post etch cleaning. The plasma species that are diffused into the low-k film may change the composition of the film and its structure. The use of oxygen containing etch/strip chemistries typically results in depletion of the carbon present in the film, making the film hydrophilic and susceptible to water (k value>>80) adsorption, which leads to an increase of the k-value of the film. This problem is becoming even more important with the miniaturization of ICs where the feature size becomes comparable to the damaged region.

Several approaches are described in the state of the art to solve the poisoning problems but these are incomplete and too complicated.

One attempt is to use a resist material that is less sensitive to poisoning. However, such resist materials compromise imaging resolution and decrease lithographic process window.

Another attempt is to modify the dielectric material so that it causes less poisoning. For example, in U.S. Pat. No. 6,147,009 to Grill et al., the use of $N_2O$ as an oxidizing carrier gas is avoided by using a siloxane-based precursor and He gas to make low-k SiCO(H) films, thereby eliminating a source of nitrogen in the as-deposited film. This may prevent poisoning of a first photoresist material on the blanket SiCO(H) film, but after the pattern is etched into the SiCO(H) film and the resist is stripped, amines may still be generated and may poison a subsequent photoresist patterning step such as would be required for dual damascene interconnects.

Another method is to eliminate poisoning of photoresist by pre-treating the low-k material with e.g. acidic compounds. In U.S. Publ. No. 2002/0081855-A1 an in-situ plasma treatment is disclosed which immediately removes the source of poisoning by reducing or eliminating poisoning at trench patterning level. However, such modifications may adversely affect the dielectric constant and other characteristics of the insulating materials.

Another approach with partial success is to deposit a barrier material after via etch. In this approach, the via is lined with a very thin layer of a barrier material such as TEOS or silane $SiO_2$, thereby encapsulating the poisoning source. The liner material must have excellent conformality. Since it is difficult to deposit materials in high-aspect ratio vias, this approach may not be extendable to future technologies. Defects in thin regions of this liner may allow poisoning gases to pass through, and even with low statistical occurrence may cause an unacceptable level of defective patterns in the line imaging layer. An example of this approach is described in U.S. Pat. No. 6,645,864.

In U.S. Pat. No. 6,713,386 to Hu et al. the low-k material is exposed after via etch to a plasma containing gas components such as oxygen, carbon dioxide, ozone or hydrogen peroxide such that a protective layer is formed on the surface of the low-k material which neutralizes nitrogen. This is however not without the risk of damaging the low-k material and increasing the k-value of the bulk low-k material.

Another approach for preventing resist poisoning during patterning is described in US Publ. No. 2004/127016-A1. The use of a dual cap layer is disclosed. The dual cap layer is formed over the low-k insulator layer prior to the etching of a via or trench toward an underlying conductor. The dual cap layer includes a layer of silicon carbide and a layer of silicon nitride. The silicon carbide layer maintains the critical dimension of the via or trench as it is etched through the insulating layer, while the silicon nitride layer inhibits the failure mechanism of resist poisoning. This approach is only valid for single damascene processing and not applicable for etching a trench over a patterned via structure with the via-first approach in dual damascene processing.

US Publ. No. 2004/0087164-A1 to Bao et al. discloses the use of an I-line or deep UV photoresist as barrier layer for use in the via-first approach for dual damascene patterning. The barrier layer is deposited on the low-k material after via etching. The resist used as barrier layer comprises hydroxy groups that can attract nitrogen containing compounds. Prior to the deposition of the barrier layer an inert polymeric resin can be deposited in the via to close the via or optionally the spin-coated barrier layer can be used to fill the via and form a coplanar layer on the damascene stack. A trench is etched within the via structure with an oxide etchant (plasma) which consumes the photoresist and BARC layers and consumes a portion of the barrier layer and resin layer. In the case of CVD low-k materials, this oxidizing plasma will cause low-k damage to the sidewalls of the trenches. After trench etching there is still a considerable amount of barrier layer and resin layer that needs to be removed by means of a wet stripping process (oxidizing solution containing $H_2SO_4/H_2O_2$) which involves a further risk of low-k damage.

US Publ. No. 2004/0266201-A1 by Wille et al. discloses an alternative method making use of a barrier layer for use in the via-first approach for dual damascene patterning. A barrier layer is deposited on the upper surface of the low-k material after via etching. A planarizing material is also here deposited to fill the via prior to the barrier layer deposition. The trench etching in the low-k material is performed by means of an $O_2$ comprising plasma which introduces low-k damage if the low-k material is a SiCO(H) material (also called CVD low-k material). The barrier layer is removed during the trench etching. The remaining part of the planarizing material in the bottom part of the via still needs to be removed (strip) by means of an $O_2$ comprising strip chemistry which introduces again damage to the sidewalls of the trenches.

Thus, the prior art proposes several solutions for eliminating resist poisoning but all of them do have serious drawbacks and shortcomings. The prior art does never provide a solution that simultaneously solves the problem of eliminating photoresist poisoning and avoiding or at least minimizing plasma damage of the dielectric material. On the contrary, some of the prior art solutions to avoid photoresist poisoning create low-k damage.

SUMMARY OF THE INVENTION

A method for patterning a dual damascene structure used in semiconductor processing is provided.

More particularly, a metal hardmask based patterning method is provided which allows elimination of resist poisoning while avoiding (or at least minimizing) low-k damage.

A method according to a preferred embodiment can be used to eliminate photoresist poisoning in dual damascene patterning, in particular to eliminate or reduce the photoresist poisoning for trench etching over a via as performed in a via-first approach, while avoiding or at least minimizing plasma damage to the sidewalls, in particular the sidewalls of the trenches in the via-first approach used for dual damascene patterning.

A method according to a preferred embodiment comprises the steps of depositing a dielectric layer on a substrate, said substrate preferably comprising a patterned structure, optionally depositing a capping layer on said dielectric layer, etching a first hole in said capping layer and said dielectric layer, depositing a gap filling material such that said first hole is completely filled, removing part of the gap filling material such that its level equals the level of said dielectric layer or the level of said capping layer, depositing a hardmask layer on said dielectric layer or if present, on said capping layer, depositing imaging material(s) on said hardmask layer, forming at least one first pattern in said imaging material(s), transferring the pattern in said hardmask layer (or opening said hardmask), removing said imaging material(s), removing said gap filling material, and etching a second hole over said first hole in said dielectric layer.

The dielectric material is preferably a low-k dielectric material and more preferably a porous CVD low-k material, for example (hydrogenated) silicon-oxy-carbide materials (SiCO(H)) such as ®Black Diamond and ®Aurora. (SiCO (H)).

The gap filling material (which can also be referred to as planarizing material) is preferably an organic material, for example, a commonly used BARC (Bottom Anti-Reflective Coating) material, the underlayer (UL) of the TIS2000® bilayer (Fujifilm Electronic Materials), SiLK®, polyarylsulfones, polyhydroxystyrene based derivatives, polyimides, polyethers (in particular polyarylene ethers e.g. FLARE® from Honeywell and VELOX® from Schumacher), polyarylenesulfides, polycarbonates, epoxies, epoxyacrylates, polyarylenes (such as polyphenylenes), polyarylenevinylenes (such as polyphenylenevinylenes), polyvinylcarbazole, cyclic olefins, and/or polyesters, etc.

The hardmask layer deposited on the surface of the dielectric material or on the capping layer is preferably a metal hardmask layer such as TaN, TiN, Ta, TaSiN, TiSiN, TiW and/or WN layer(s), which acts as a barrier layer preventing migration of amine compounds through the low-k material towards upperlaying imaging layer(s) (e.g. photoresist layer (s)).

The first problem of avoiding resist poisoning is thus solved by means of a barrier layer; preferably said barrier layer is a hardmask layer and more preferably is a metal hardmask layer.

In a method of a preferred embodiment, said imaging material(s) preferably comprise(s) at least one photoresist layer and optionally at least one anti-reflective coating layer (e.g. BARC).

In a preferred embodiment, the removal of part of the gap filling material is achieved by etching back said gap filling layer such that its level equals the level of the capping layer (i.e. both gap filling and capping layer levels are aligned). If there is no capping layer, its level is aligned on the top of the dielectric layer.

Said etching can be an isotropical or anisotropical dry-etch process.

In a method of a preferred embodiment, the removal of part of the gap filling material can also be achieved by chemical mechanical polishing said planarizing layer, wherein the capping layer is used as stop layer such that the (level of the) gap filling material equals the level of the capping layer. And if there is no capping layer, its level is aligned on the top of the dielectric layer.

To solve the second problem of sidewalls damage, the dielectric material is anisotropically etched using a dry etch plasma that is an oxygen free plasma.

Preferably, the oxygen free plasma used in the anisotropically dry-etch process is selective towards the (metal) hardmask layer.

The second hole can thus be etched over the first hole by means of an anisotropically dry-etch process wherein the plasma is oxygen free and is preferably selective towards said hardmask layer.

More particularly, in a via-first approach, a trench can thus be etched over a via by means of an anisotropically dry-etch process wherein the plasma is oxygen free and is preferably selective towards said hardmask layer.

The anisotropical etching chemistry used for etching said second hole in said dielectric layer present the advantage of avoiding or at least minimizing plasma damage to the sidewalls of the hole in the dielectric material.

In a method according to a preferred embodiment, the removal of the imaging material(s) can be performed prior to or after the removal of the gap filling material.

Preferably, in a method according to a preferred embodiment, the removal (strip) of the imaging material(s) and the removal of the gap filling material are performed simultaneously or in other words in one single step.

In a method of a preferred embodiment, the removal of the imaging material(s) can be performed prior to the etching of the second hole or simultaneously (in one single step).

In a method according to a preferred embodiment, wherein said etching of said second hole is performed in a (distinct) separate step, said oxygen free plasma further contains fluorocarbon compounds ($C_xH_yF_z$ compounds) (such as $CHF_3$, $CH_3F$, $CH_2F_2$, $CF_4$, $C_2F_6$, $C_4F_8$, $C_5F_8$ etc) and nitrogen. Preferably, said oxygen free plasma comprises $C_4F_8$ and nitrogen.

Said etch plasma may further contain inert compounds such as argon, etc.

Alternatively and also preferably, the step of removing the imaging layer(s) and the step of etching a second hole (or more specifically of etching a trench in a via-first-approach) in the dielectric layer are performed simultaneously (i.e. in one single step) by means of an anisotropical etching process using said oxygen free plasma.

When the removal of the imaging material(s) and the etching of said second hole are performed simultaneously (i.e. in one single step), said oxygen-free plasma is a hydrogen containing plasma.

Said oxygen free plasma may further contain fluorocarbon compounds ($C_xH_yF_z$ compounds) (such as $CHF_3$, $CH_3F$, $CH_2F_2$, $CF_4$, $C_2F_6$, $C_4F_8$, $C_5F_8$ etc).

Preferably, said hydrogen containing plasma comprises $CF_4$.

Preferably, $CF_4$ is present in a small amount. For example, the $CF_4$ flow is comprised between (about) 0.1% and (about) 1% of the total flow, preferably between (about) 0.2% and (about) 0.7% of the total flow. Preferably, the $CF_4$ flow is (about) 0.5% of the total flow.

Said oxygen-free, hydrogen containing plasma may further comprise nitrogen.

More preferably, in a method according to a preferred embodiment, the step of etching the second hole in the dielectric material and the step of removing both the imaging layer (s) and the gap filling material are performed simultaneously (i.e. in one single step).

In other words, the same oxygen free plasma can be used for stripping the photosensitive layer(s), for removing the gap filling material and for etching the second hole.

In such a method, the oxygen free plasma is a hydrogen-comprising plasma, which may further comprise fluorocarbon compounds ($C_xH_yF_z$ compounds), more particularly $CF_4$.

Preferably, a method according to a preferred embodiment further comprises the step of depositing a dielectric barrier layer upon said substrate, before the step of depositing said dielectric layer.

Said dielectric barrier layer can act as an etch stop layer and can also act as copper barrier layer.

A method of a preferred embodiment may further comprise the step of depositing a copper barrier layer and optionally a copper seed layer onto the sidewalls of the via and trench.

A method of a preferred embodiment may further comprise the step of depositing copper within the trench and via and the step of removing the overburden of copper, copper barrier layer, copper seed layer (if any) and remaining (metal) hardmask layer, which are underneath said overburden of copper, by means of chemical mechanical polishing.

A method according to a preferred embodiment can be used in a full-via-first process (first-via approach) for forming a dual damascene interconnect structure on a patterned structure.

In the context of a preferred embodiment, the substrate is preferably a semiconductor substrate comprising a patterned structure.

Said patterned structure is preferably a single damascene interconnect structure.

Said single damascene interconnect structure is preferably a copper containing structure patterned in a dielectric layer.

Preferably, before the step of depositing said dielectric layer, a dielectric barrier layer is deposited upon said substrate (or upon said patterned structure).

Alternatively, a method of a preferred embodiment can be used in a partial-via-first approach for forming a dual damascene interconnect structure.

In a partial-via-first method, said dual damascene interconnect structure is formed upon a patterned structure.

In a partial-via-first method of a preferred embodiment, a second dielectric barrier layer can be deposited upon said dielectric layer and a second dielectric layer can be deposited upon said second dielectric barrier layer (before the optional step of depositing said capping layer).

In a first-via approach or in a partial first-via approach, the first hole corresponds to a via and the second hole, etched over the first one, corresponds to a trench.

The preferred embodiments also relate to a device obtainable by a method according to a preferred embodiment.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

DETAILED DESCRIPTION OF THE PREFERRED EMBODIMENT

Figure 1B:
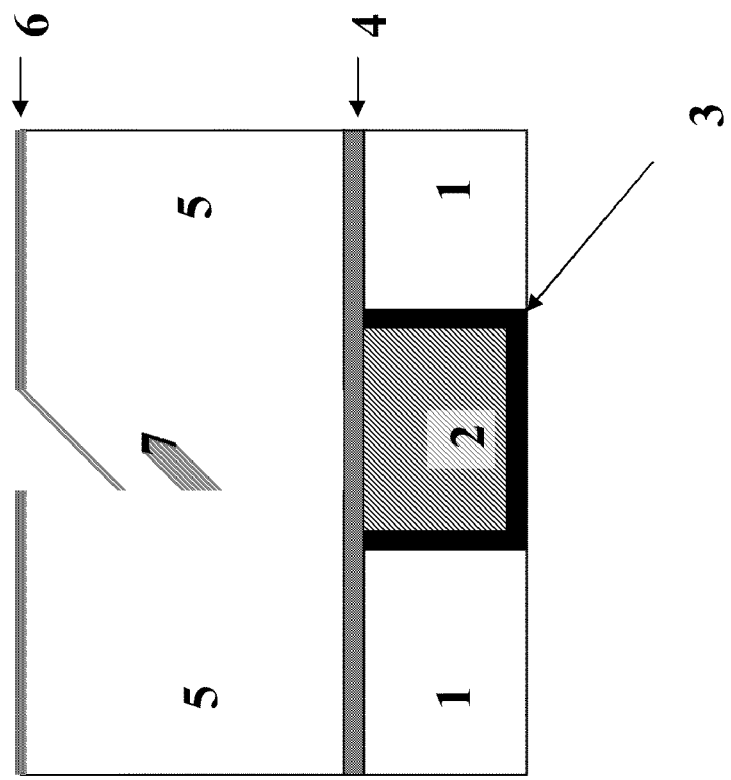
FIGS. 1A to 1L illustrate the method for patterning a dual damascene structure using the different processing steps of the preferred embodiments based on a via first approach.
Figure 1A:
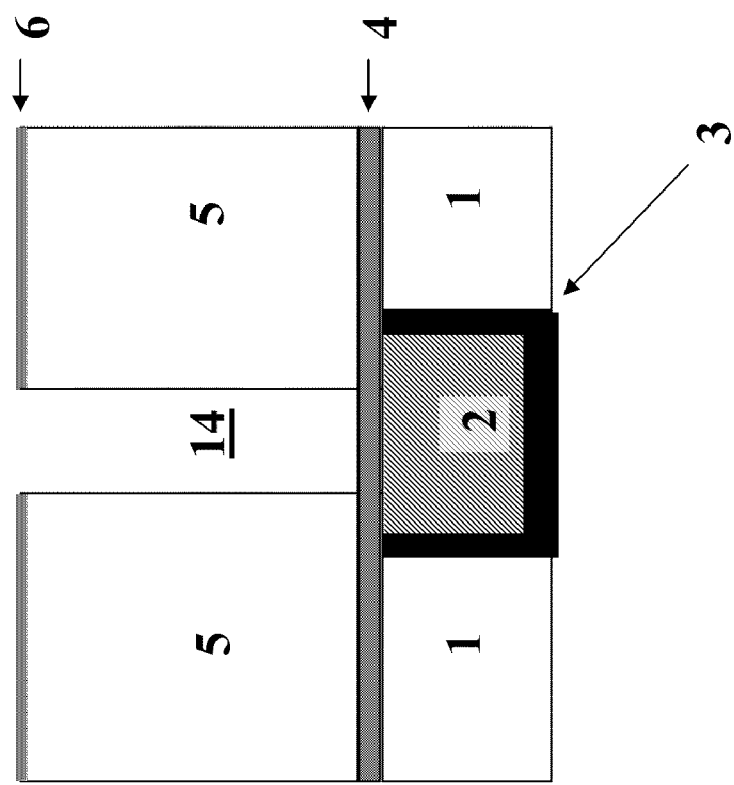
Figure 1D:
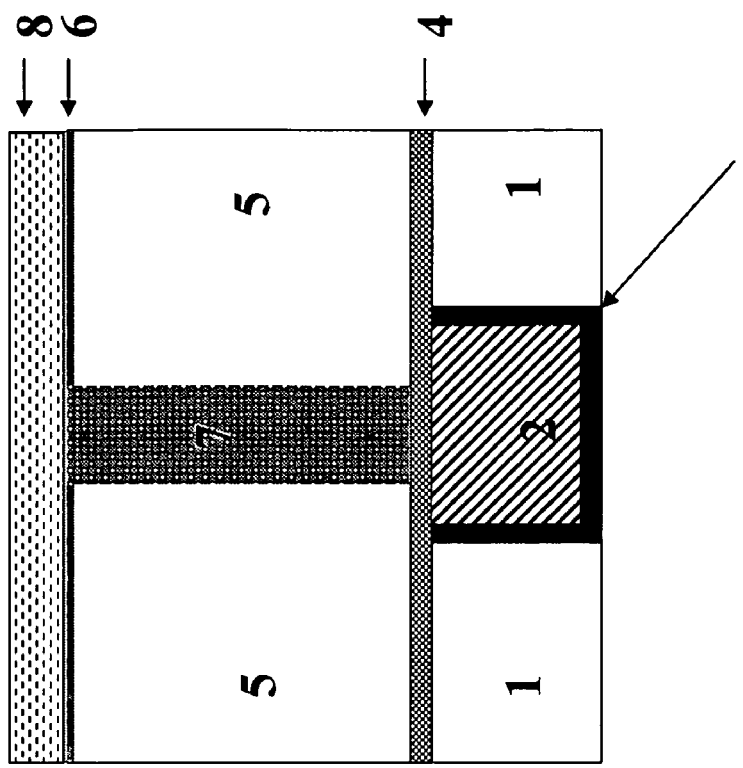
Figure 1C:
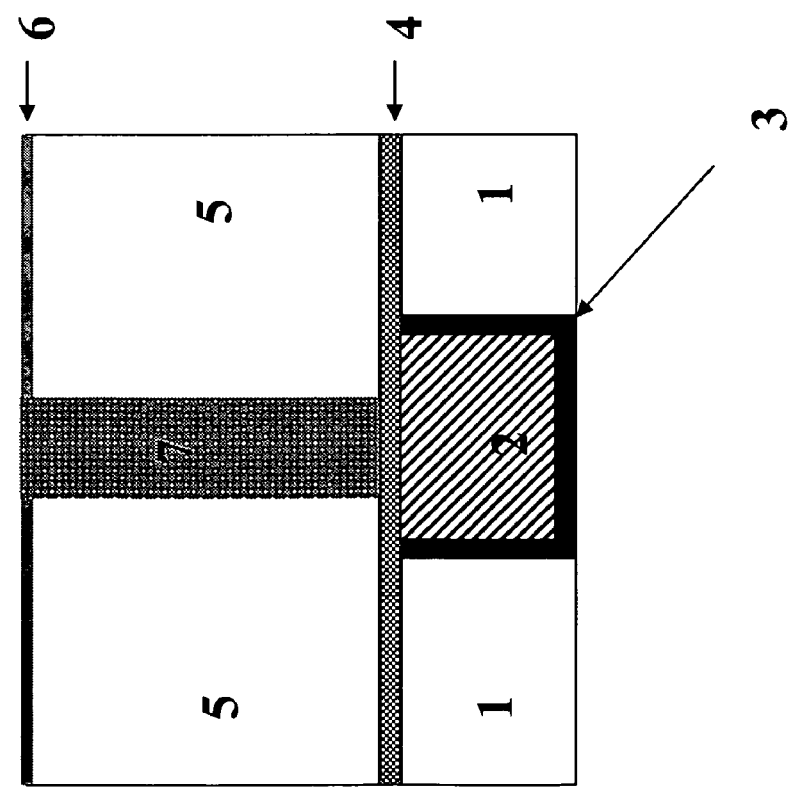
Figure 1F:
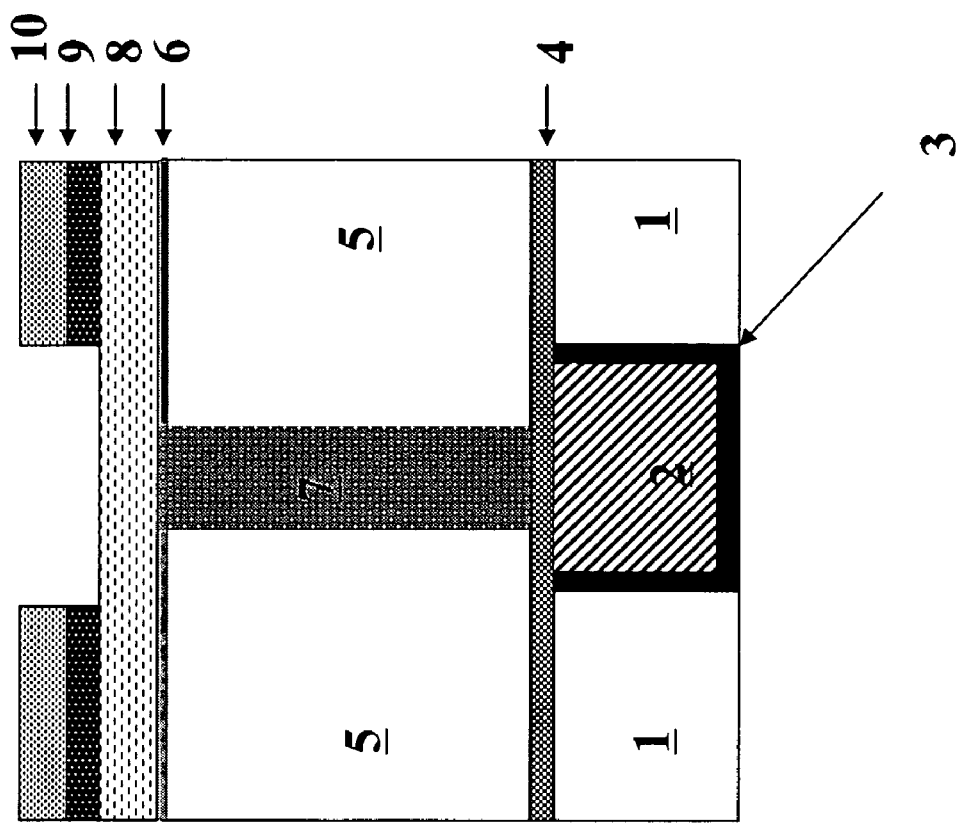
Figure 1E:
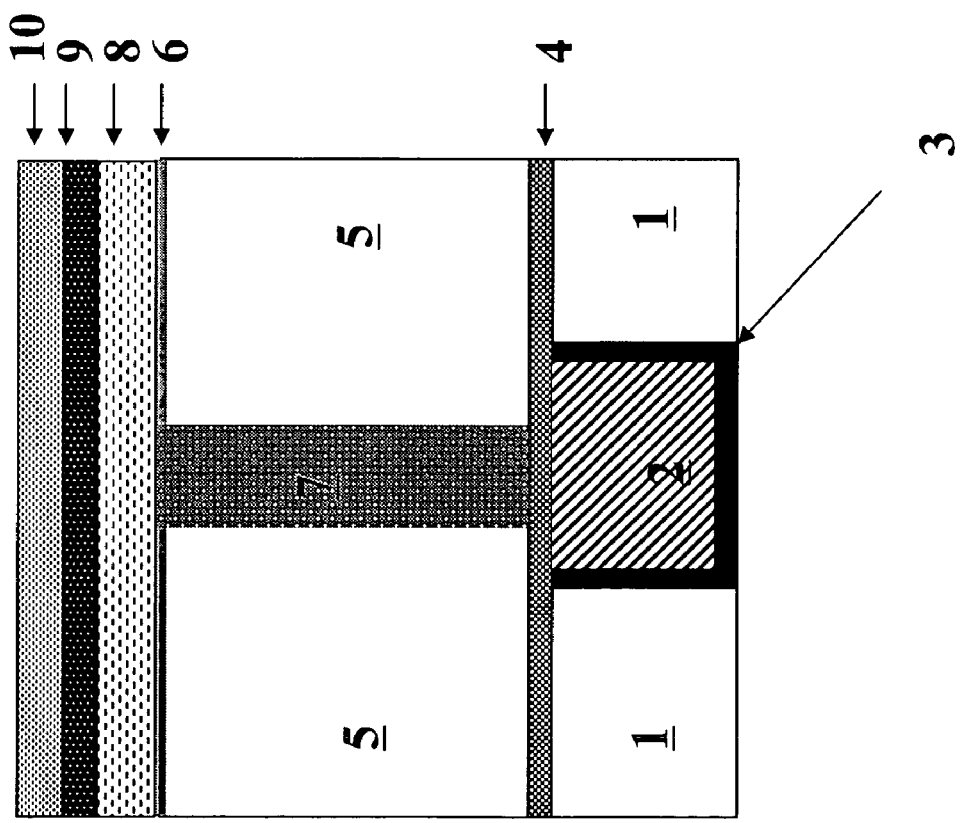

The following description illustrates an alternative method for patterning a (dual) damascene structure thereby at least eliminating photoresist poisoning and additionally avoiding or at least minimizing plasma damage of the dielectric material. It will be appreciated that there are numerous variations and modifications possible.

For a dual damascene patterning, a preferred embodiment is based on using a combination of first depositing a gap filling material (in a via) and a (metal) hardmask to eliminate photoresist poisoning to solve the first problem and second performing a dry-etch process selective towards said (metal) hardmask such that the second problem of plasma damage to the dielectric material is avoided or at least minimized during patterning of a (dual) damascene structure.

It should be noted here that the via-first and the trench-first sequences are the processes currently being used in mainstream production for patterning of dual damascene structures.

In the via-first approach the vias are defined first in the ILD (Inter Level Dielectric or Inter Layer Dielectric used to electrically separate closely spaced interconnect lines), followed by patterning the trenches.

The sequence of forming the damascene structure in this approach begins by exposing the via patterns with the first mask. After etching the vias completely through the entire dielectric stack and stripping the resist, a second mask is used to pattern the trenches.

The preferred embodiments are focused on at least eliminating photoresist poisoning for trench patterning over the via and avoiding or at least minimizing plasma damage to the dielectric material during trench etching.

More specifically the trench etching is optimized such that damage to the sidewalls of the trenches is minimized.

A method for patterning a dual damascene structure used in semiconductor processing is provided.

The patterning is further characterized as a metal hardmask based patterning eliminating resist poisoning and avoiding or at least minimizing low-k damage.

The method is used to eliminate photoresist poisoning in dual damascene patterning and in reducing the photoresist poisoning for trench etching over a via as performed in a via-first approach.

The method is further characterized in avoiding or at least minimizing plasma damage to the sidewalls of the trenches in the via-first approach used for dual damascene patterning.

A hardmask layer, more preferably a metal hardmask layer such as TaN or TiN is deposited on the surface of the dielectric material as barrier layer to prevent migration of amine compounds through the low-k material towards upperlaying photosensitive imaging layer(s) (e.g. photoresist layer(s)).

The first problem of avoiding resist poisoning is thus solved by means of a barrier layer, preferably said barrier layer is hardmask layer and most preferred a metal hardmask layer.

The trenches are etched over a via (via-first approach) by means of an anisotropically dry-etch process that is selective towards said hardmask layer.

To solve the second problem of sidewall damage the dry etch plasma used for anisotropically etch the dielectric material is selective towards the (metal) hardmask layer and is an oxygen free plasma.

Performing the removal of the photosensitive layers and gap filling materials prior to or simultaneously with the etching of the trenches avoids also further damage to the dielectric material, more specifically to the sidewalls of the trenches. The problem of exposure of the sidewalls of the trenches to the strip chemistry comprising oxygen is thus avoided.

The method comprises the steps of depositing a dielectric layer on a semiconductor substrate; depositing a capping layer on said dielectric layer; etching a first hole (via) in said capping layer and dielectric layer, depositing a gap filling material such that at least a complete filling of the hole is achieved; removing part of the gap filling material such that it equals the level of the capping layer; depositing a hardmask layer; depositing imaging material(s) on said hardmask layer; forming at least one first pattern in the layers of imaging material(s), transfer the pattern in the hardmask layer and removing the imaging material(s) and gap filing material; etching a second hole (trench) in the dielectric layer.

Finally a copper barrier layer and optionally a copper seed layer are deposited onto the sidewalls of the via and trench. Finally copper is deposited within the trench and via and the overburden of copper, copper barrier and remaining (metal) hardmask layer are removed by means of chemical mechanical polishing.

Preferably the removal of the imaging material(s) and the removal of the gap filling material are performed simultaneously or in other words in the same step. Alternatively the removal of the imaging material(s) is performed prior to the removal of the gap filling material.

In another preferred sequence, the method of etching the second hole in the dielectric material and removal of the imaging material(s) and/or gap filling material are performed simultaneously or in other words in the same step.

The dielectric material is preferably a low-k dielectric material and more preferably a porous CVD low-k material (e.g. SiCO(H)). The planarizing material is preferably an organic gap filling material. The hardmask layer is preferably a metal hardmask layer.

The method may further comprise the steps of depositing a layer of anti-reflective coating (BARC) prior to the deposition of (an) imaging material(s).

In a preferred embodiment, the removal of part of the gap filling material is achieved by etching back said gap filling layer such that it equals the level of the capping layer. Said etching can be an isotropical or anisotropical dry-etch process.

In another preferred embodiment, the removal of part of the gap filling material is achieved by chemical mechanical polishing said planarizing layer wherein the capping layer is used as stop layer such that the gap filling material equals the level of the capping layer.

In a preferred embodiment, a full-via-first method is provided for forming a dual damascene interconnect structure on a semiconductor substrate comprising at least one patterned conductor.

Alternatively, a method is provided for forming a dual damascene interconnect structure using a partial-via-first approach.

The partial-via-first method preferably makes use of an intermediate dielectric barrier.

The preferred embodiments are further characterized in the fact that the etching of the trench in the dielectric material is selective towards the hardmask layer. Most preferred said hardmask layer is a metal hardmask and the dielectric material is a CVD type low-k material.

Preferably the anisotropical etching chemistry for etching a second hole (trench) in the dielectric layer is characterized as an etch chemistry avoiding or at least minimizing plasma damage to the sidewalls of the trench. In a preferred process flow the removal of the imaging material(s) is performed prior to the etching of the second hole (trench) and the etch chemistry is an oxygen free plasma. The etch chemistry of this etch process preferably avoids or at least minimizes plasma damage to the dielectric material. The plasma is an oxygen-free plasma containing $C_xH_yF_z$ compounds (fluorocarbon compounds), more preferred the $C_xH_yF_z$ compound is $C_4F_8$. The etch plasma further contains nitrogen and may contain inert compounds such as argon, etc.

Alternatively and also preferred the anisotropical etching chemistry for etching a second hole or more specific for etching a trench in the dielectric layer is characterized as an etch chemistry minimizing plasma damage to the sidewalls of the trench whereby the removal of the imaging material(s) is performed simultaneously to the etching of the second hole (trench) and the etch chemistry is an oxygen free plasma. The etch plasma is further characterized as an hydrogen comprising plasma, more specifically this plasma is a hydrogen and optionally $C_xF_y$ comprising plasma without using oxygen thereby minimizing plasma damage to the low-k material.

Dual Damascene Patterning Method Based on Full-Via-First Approach.

The method of the preferred embodiments for patterning of a (dual) damascene structure based on the full-via-first approach will be described in detail. The method is characterized in eliminating photoresist poisoning during trench patterning. The method is further characterized in avoiding or at least minimizing plasma damage to the dielectric material during trench etching. The method is schematically presented in FIGS. 1A to 1L and will now be described in detail.

Preferably the starting point is a semiconductor substrate comprising a patterned structure, preferably said patterned structure is a single damascene interconnect structure, further referred to as first trench 14.

Said patterned structure comprises a copper structure 2 patterned in a dielectric material 1, a copper diffusion barrier layer 3.

The dielectric material 1 is preferably a low-k material and more preferably a silicon-containing low-k material. Examples of these silicon containing low-k materials are CVD (Chemical Vapor Deposition) type low-k materials such as (hydrogenated) silicon-oxy-carbide materials (SiCO(H)) such as ®Black Diamond and ®Aurora.

Preferably a dielectric barrier 4 is deposited upon said substrate (or upon said patterned structure).

Preferably said dielectric barrier 4 is a SiC(N) layer, which can be used as an etch stop layer in further processing steps. Other examples of dielectric barriers include TEOS oxide, silane oxide and $Si_3N_4$.

A layer of dielectric material 5 is then deposited on said substrate (or upon said patterned structure).

Preferably the dielectric material 5 is a low-k material and more preferably a CVD low-k material. Examples of these CVD low-k materials are commercially available materials such as ®Black Diamond, ®Aurora, etc.

Dielectric layers 1 and 5 are preferably of the same materials.

An optional capping layer 6 is deposited above the dielectric layer 5. This capping layer may be formed of SiC(N), nitride- or oxide-type materials such as TEOS-oxide, silane-oxide.

Then a hole 14, more specifically a via hole, is formed in the dielectric layer 5 by using conventional patterning techniques making use of photolithography followed by an anisotropic dry etch process to transfer the pattern in the photoresist layer to the capping layer 6 (if any) and dielectric layer 5 (not shown).

The dielectric barrier layer 4 can be used as an etch stop layer during the anisotropic dry etching.

A conventional strip process combined with cleaning (to make sure that no residues are left) removes the remaining photoresist.

A gap filling material 7 is then deposited in the via hole such that at least a complete filling of the hole (via) is achieved.

Preferably the gap filling material 7 is an organic spin-on material. Examples of such materials are the underlayer (UL) of the TIS2000 bilayer (Fujifilm Electronic Materials), SiLK®, polyarylsulfones, polyhydroxystyrene based derivatives, polyimides, polyethers (in particular polyarylene ethers e.g. FLARE® from Honeywell and VELOX® from Schumacher), polyarylenesulfides, polycarbonates, epoxies, epoxyacrylates, polyarylenes (such as polyphenylenes), polyarylenevinylenes (such as polyphenylenevinylenes), polyvinylcarbazole, cycloolefins, polyesters, etc.

The overburden of the gap filling material 7 is then removed such that its level equals the level of the capping layer 6. If there is no capping layer, its level is then aligned on the top of the dielectric layer 5.

The removal of the gap filling material 7 is preferably done by a dry-etch process, also referred to as "etchback".

Subsequently a diffusion barrier layer 8 to eliminate photoresist poisoning in further processing is deposited.

The diffusion barrier layer 8 is a hardmask layer, more preferred a metal hardmask layer. Examples of these metal hardmask layers are TaN, TiN, Ta, TaSiN, TiSiN, TiW, and WN.

Imaging material(s) is (are) then deposited and a pattern to define the trench over the via is transferred to the imaging material(s).

The imaging material(s) can consist of at least one photoresist layer 10 and optionally of at least one anti-reflective coating 9 (e.g. a Bottom Anti-Reflective Coating or BARC).

Preferably said imaging materials consist of at least one photoresist layer 10 and of at least one anti-reflective coating 9 (e.g. a Bottom Anti-Reflective Coating or BARC).

After the hardmask layer 8, and possibly also the capping layer 6, are opened, the imaging material(s) (photoresist layer (s) 10 and if any anti-reflective coating 9), and gap filling material 7 are removed by means of a stripping process.

The stripping process can be e.g. by means of a $SF_6/O_2$ dry strip plasma.

Figure 1H:
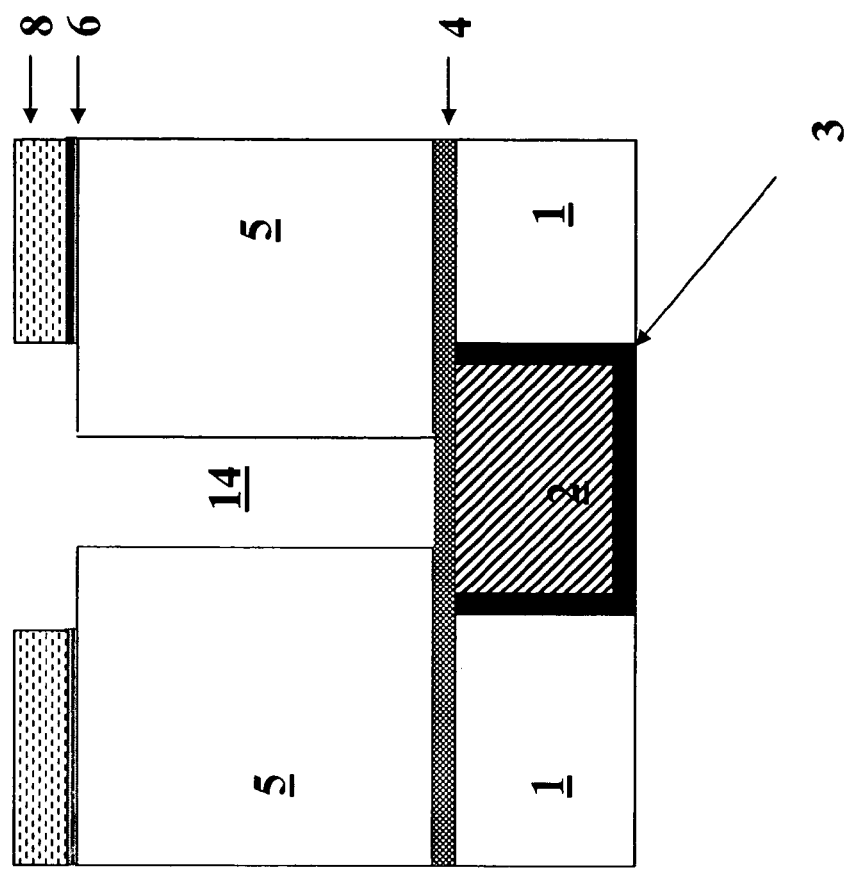
Figure 1G:
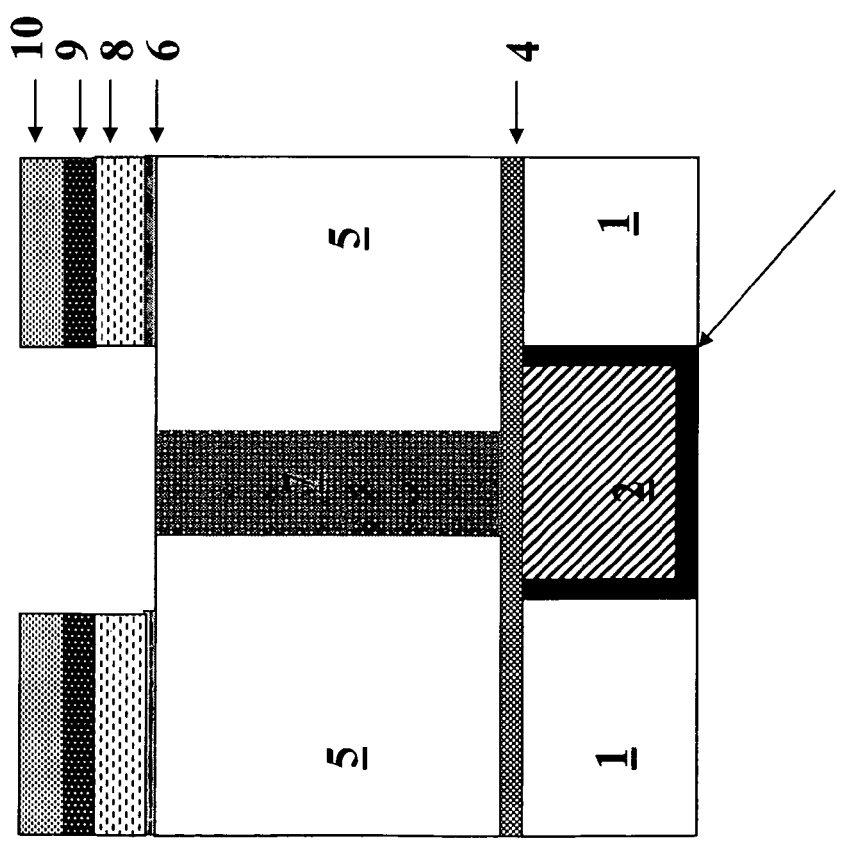
Figure 1J:
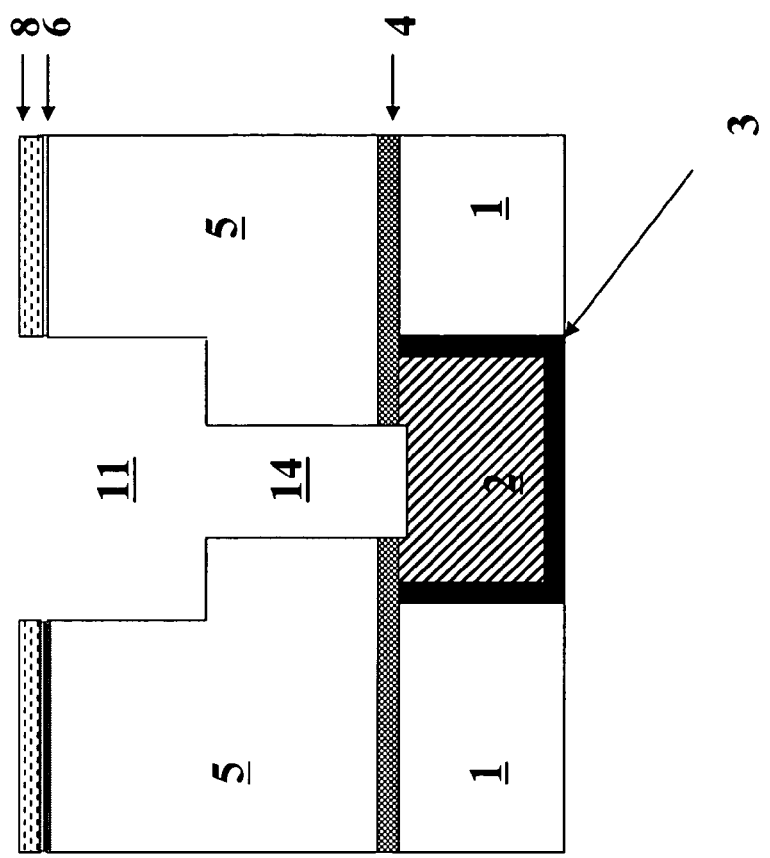
Figure 1I:
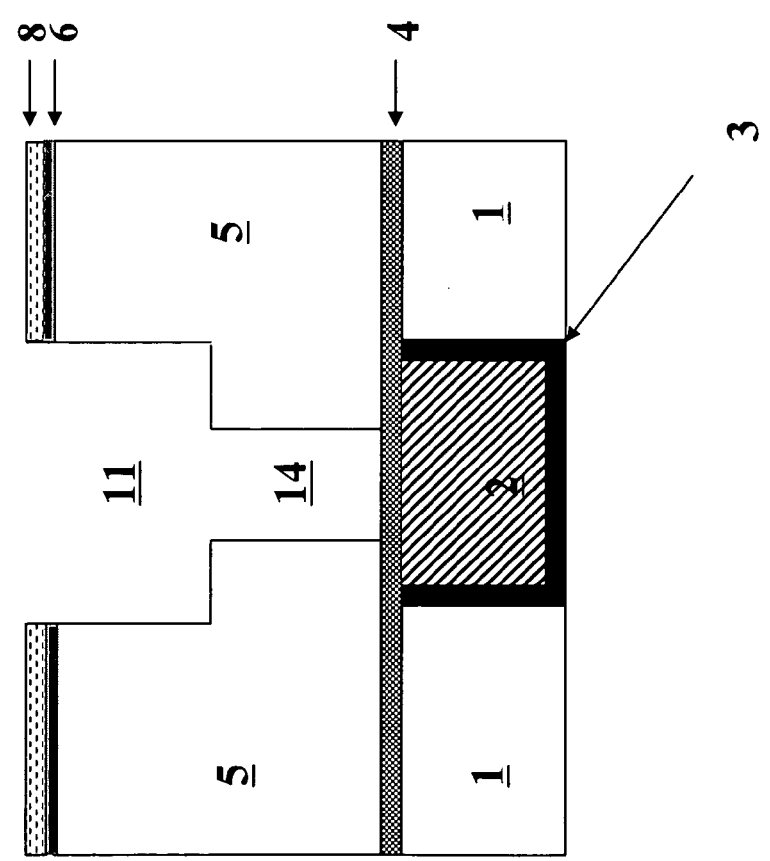
Figure 1L:
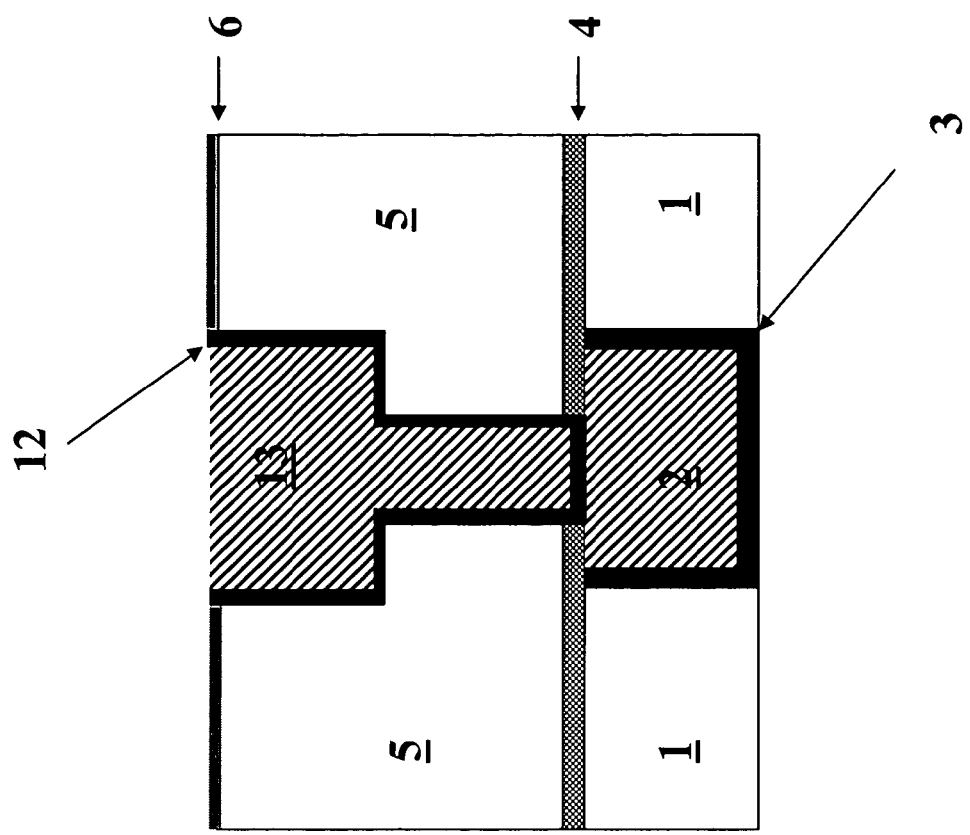
Figure 1K:
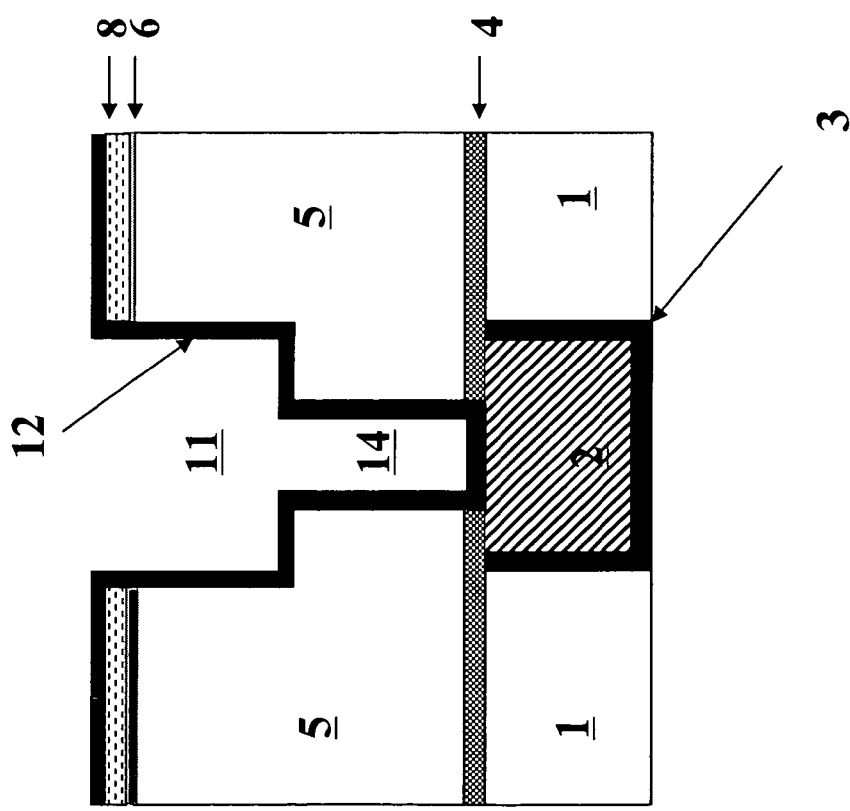
Figure 2:
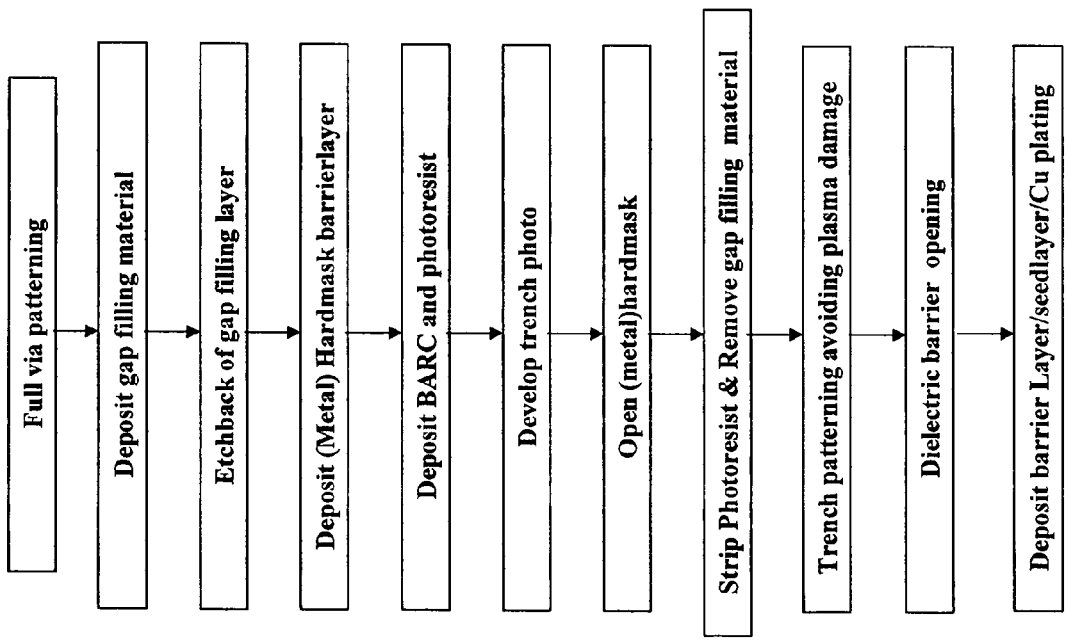
FIG. 2 is a flowchart representing the different processing steps of a preferred embodiment.
Figure 3:
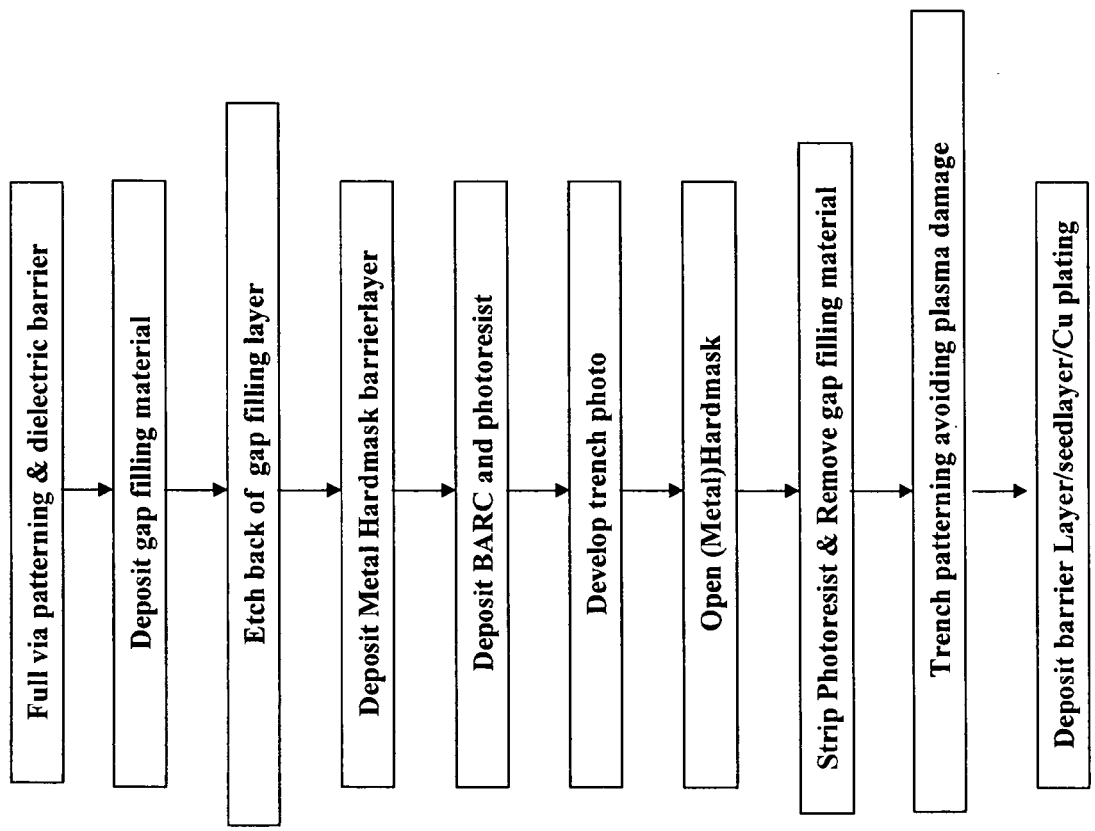
FIG. 3 is an alternative flowchart representing the different processing steps of another preferred embodiment. The opening of the SiC layer at the bottom of the via is opened here before the patterning of the trench.

Preferably the removal (strip) of imaging material(s) (photoresist layer(s) 10 and if any anti-reflective coating 9) and gap filling material 7 in the via are performed simultaneously (FIG. 1H). Alteratively, the gap filling material 7 is removed before the imaging material(s) (photoresist layer(s) 10 and if any anti-reflective coating 9) (FIGS. 1Ha and 1Hb).

Complete removal of the gap filling material and imaging material(s) prior to the dry etching of the trench over the via avoids a first cause of possible sidewall damage of the trenches.

To etch the second opening 11 or "trench" in the dielectric material an anisotropic etch process which is selective towards the hardmask is used.

More specifically an etch process is used that is selective towards a metal hardmask layer.

The etch chemistry of this etch process is further characterized such that it avoids plasma damage to the dielectric material. Preferably this plasma is an oxygen-free plasma containing fluorocarbon compounds ($C_xH_yF_z$ compounds), more preferred the $C_xH_yF_z$ compound is $C_4F_8$.

The etch plasma can further contain nitrogen and may contain inert compounds such as argon, etc.

A Cu diffusion barrier layer 12 is deposited in the trench and via openings to avoid migration of copper in the surrounding dielectric (low-k). Common used copper diffusion barrier layers 12 such as Ta(N), Ti(N), WNC, etc., can be used here.

Subsequently the trench and via hole is electroplated with copper 13.

The remaining part of the (metal) hardmask layer, the overburden of copper and overburden of copper diffusion barrier layer is then removed by means of conventional chemical mechanical polishing.

Figure 4:
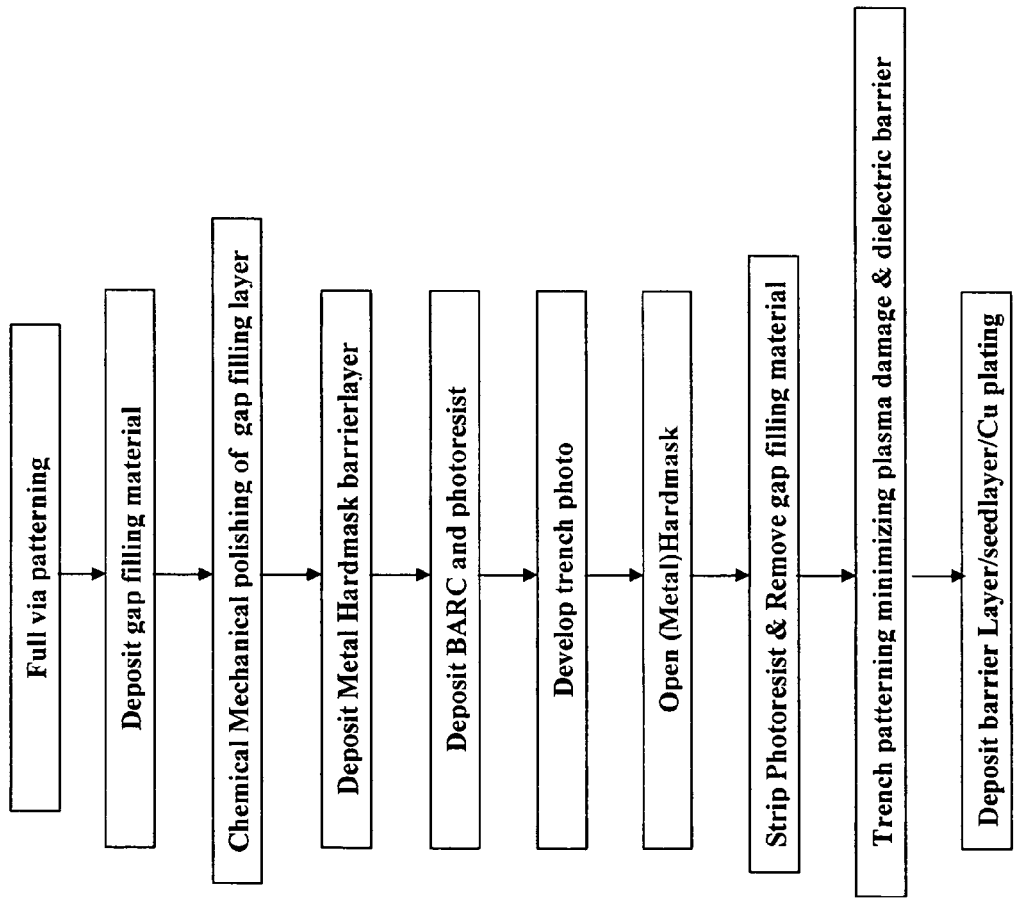
FIG. 4 is an alternative flowchart representing the different processing steps of another preferred embodiment. The gap filling material is planarized by means of chemical mechanical polishing.

Alternatively to the method described above and also preferred, the overburden of the gap filling material 7 is removed such that it equals the level of the capping layer 6 by means of Chemical Mechanical Polishing (CMP). This alternative process flow is schematically shown in FIG. 4.

Figure 5:
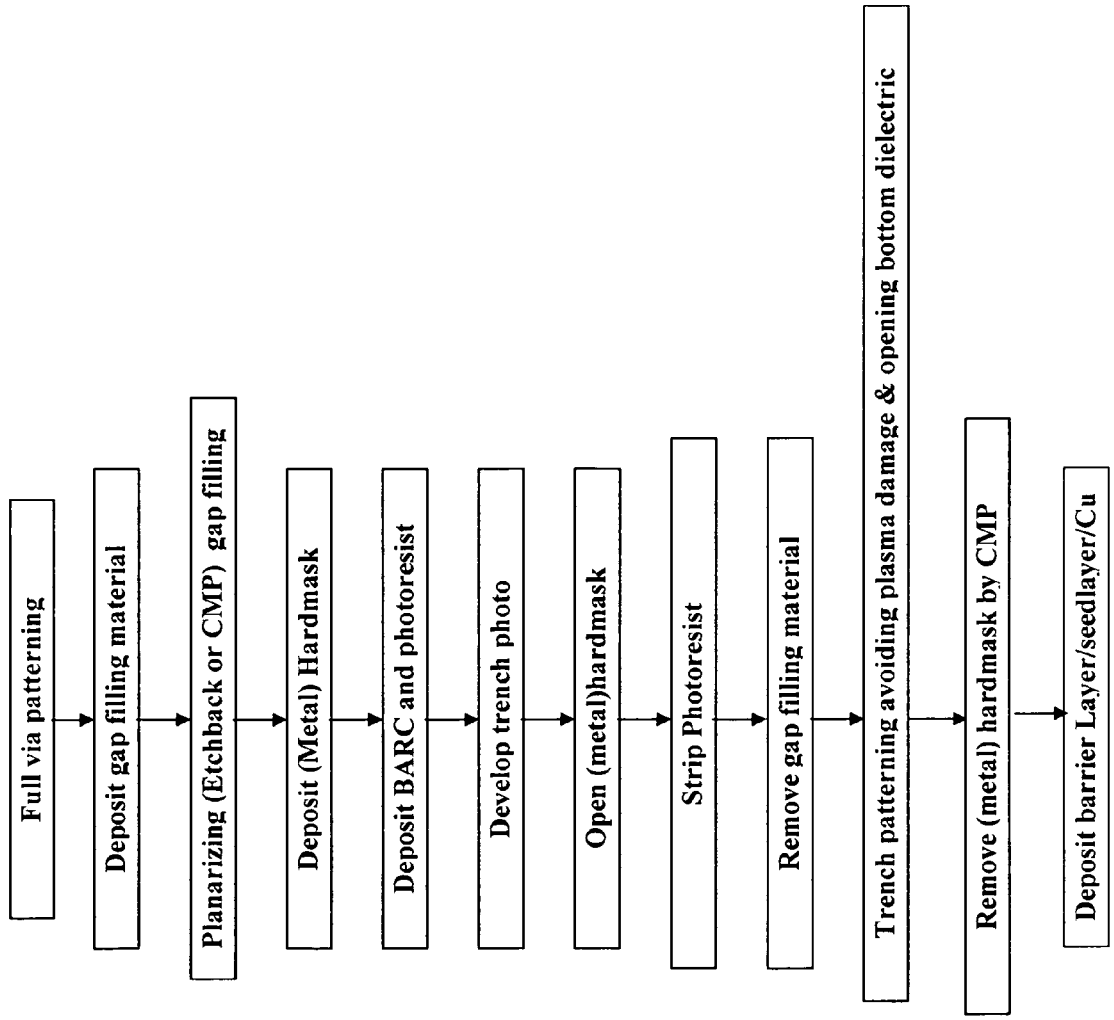
FIG. 5 is an alternative flowchart representing the different processing steps of another preferred embodiment. The photoresist is stripped before the removal of the gap filling material in the via.

Alternatively to the method described above and also preferred, the removal (strip) of the imaging material(s) (10 and if any 9, respectively photoresist and BARC layers) is performed prior to the removal of the gap filling material 7. This alternative process flow is schematically shown in FIG. 5.

Figure 6:
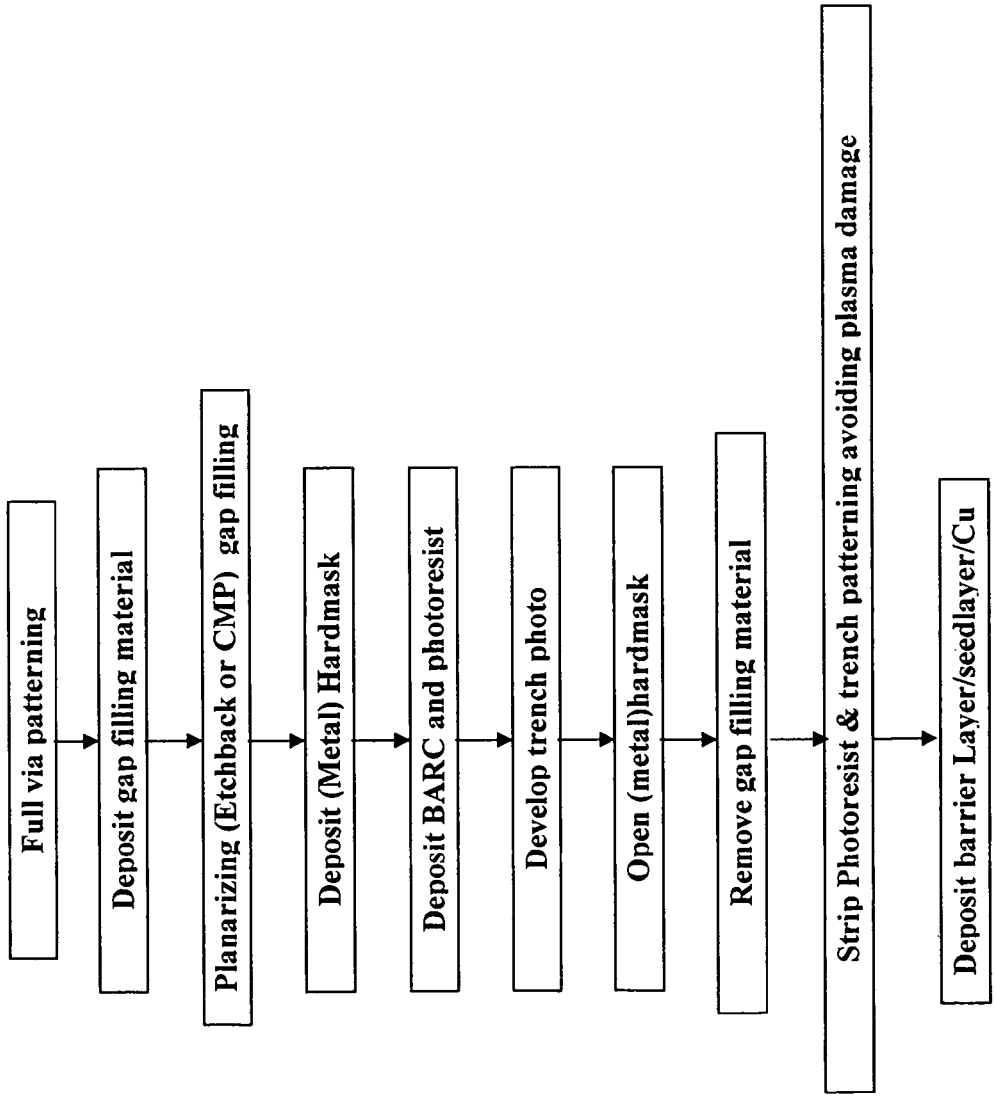
FIG. 6 is an alternative flowchart representing the different processing steps of another preferred embodiment. The photoresist and trench patterning are performed simultaneously.
Figure 7B:
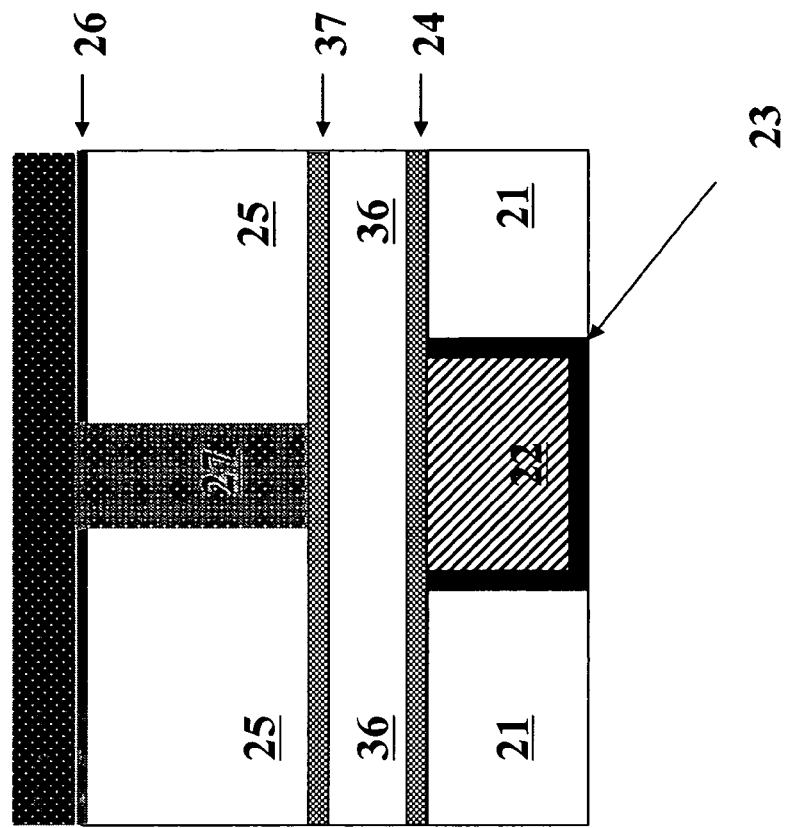
FIGS. 7A to 7M illustrate the method for patterning a dual damascene structure using the different processing steps of a preferred embodiment based on a partial-via-first approach with intermediate dielectric barrier.
Figure 7A:
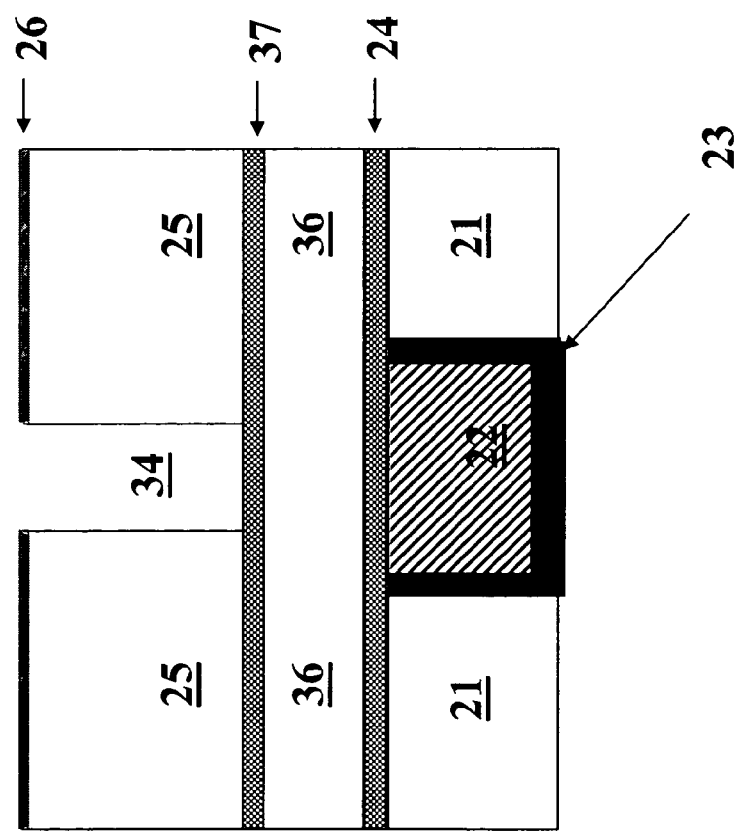
Figure 7D:
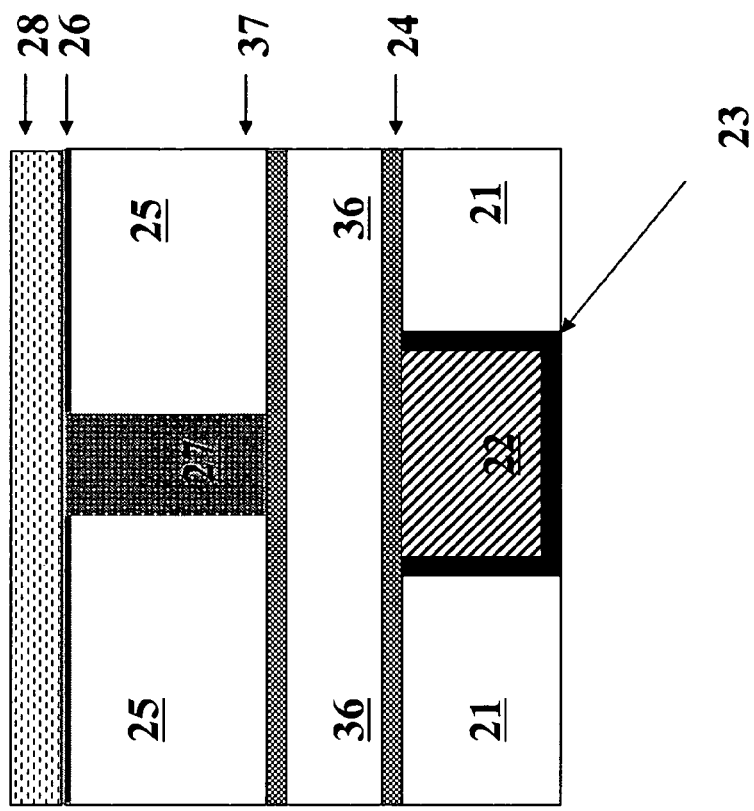
Figure 7C:
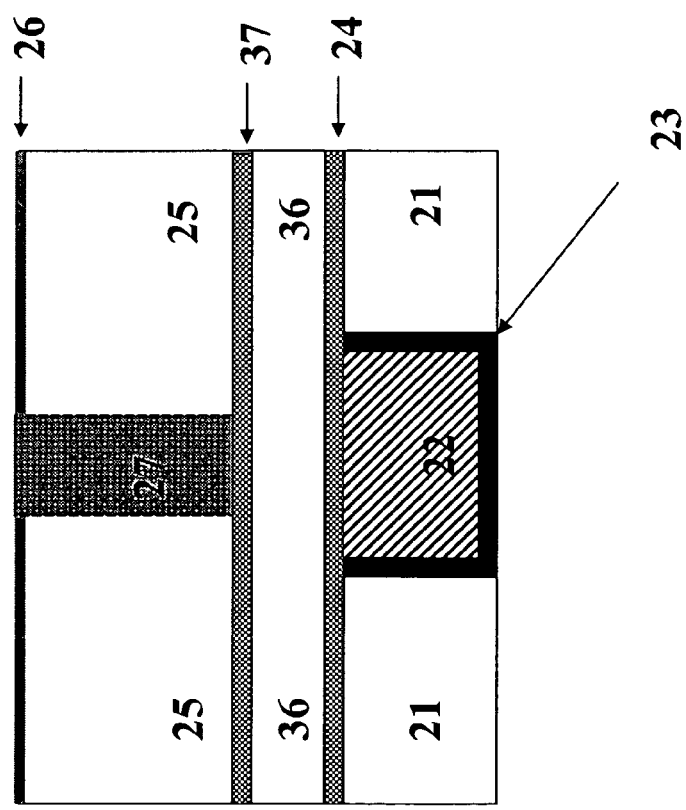
Figures 7E, 7F:
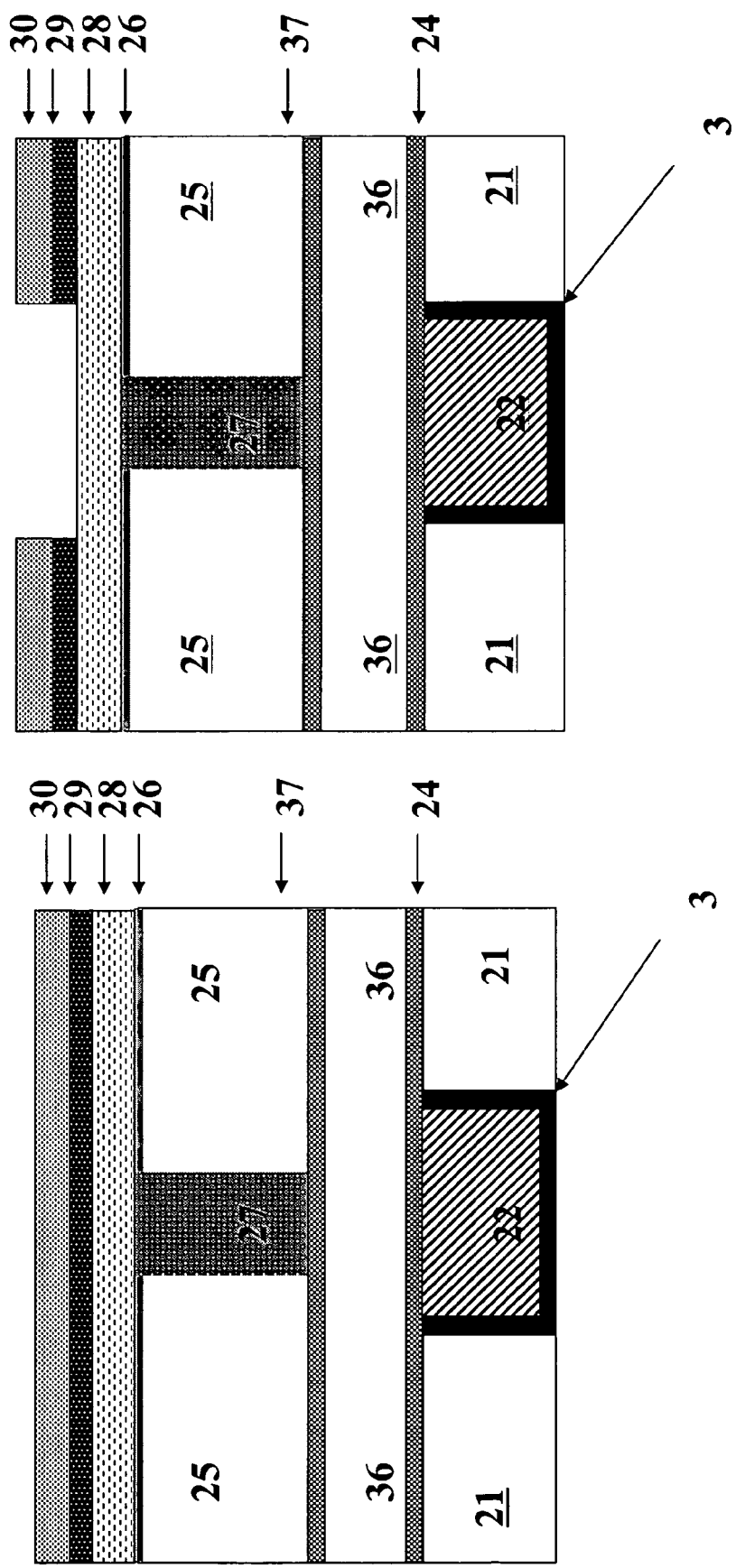
Figures 7G, 7H:
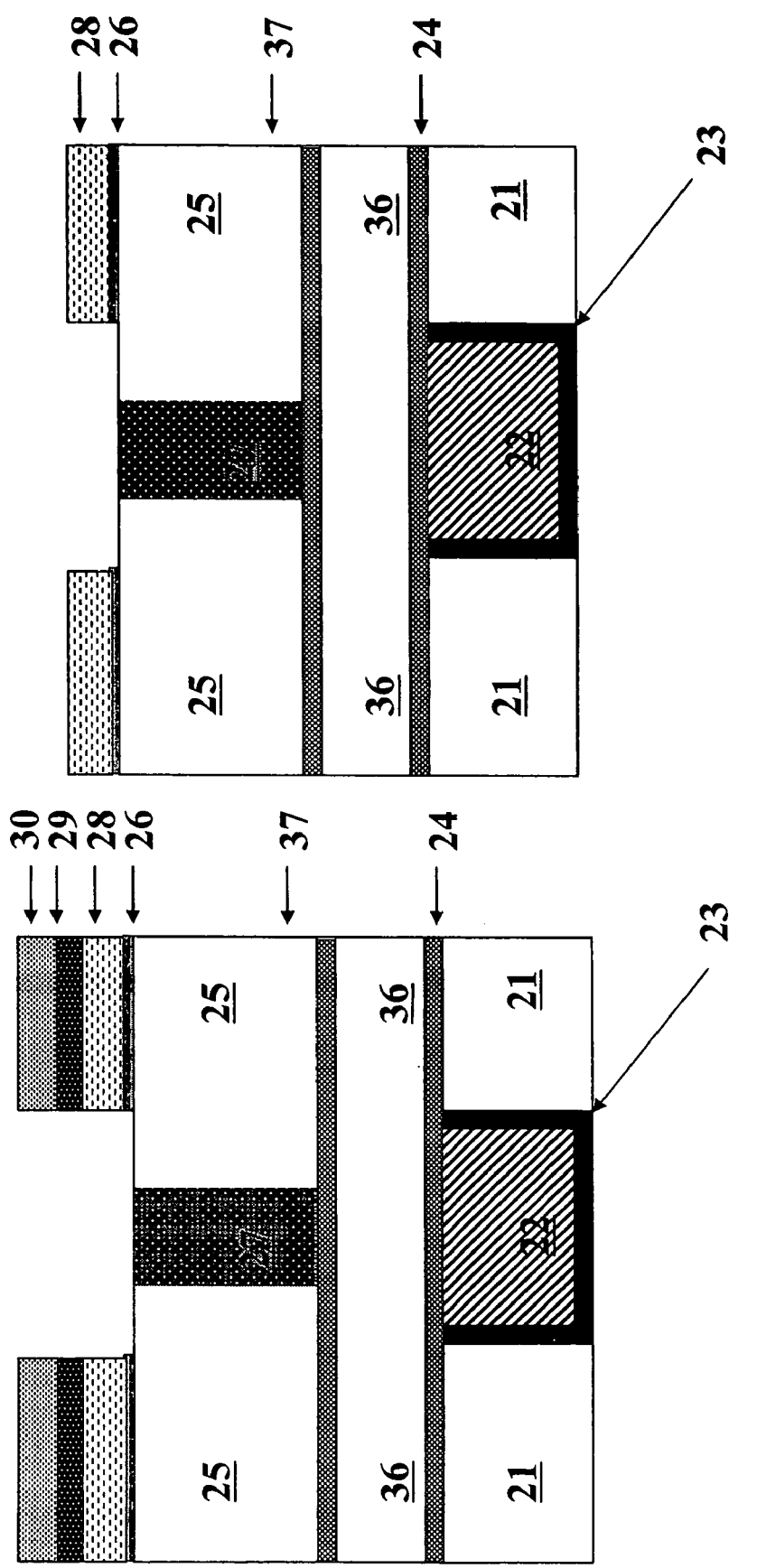
Figures 7I, 7J:
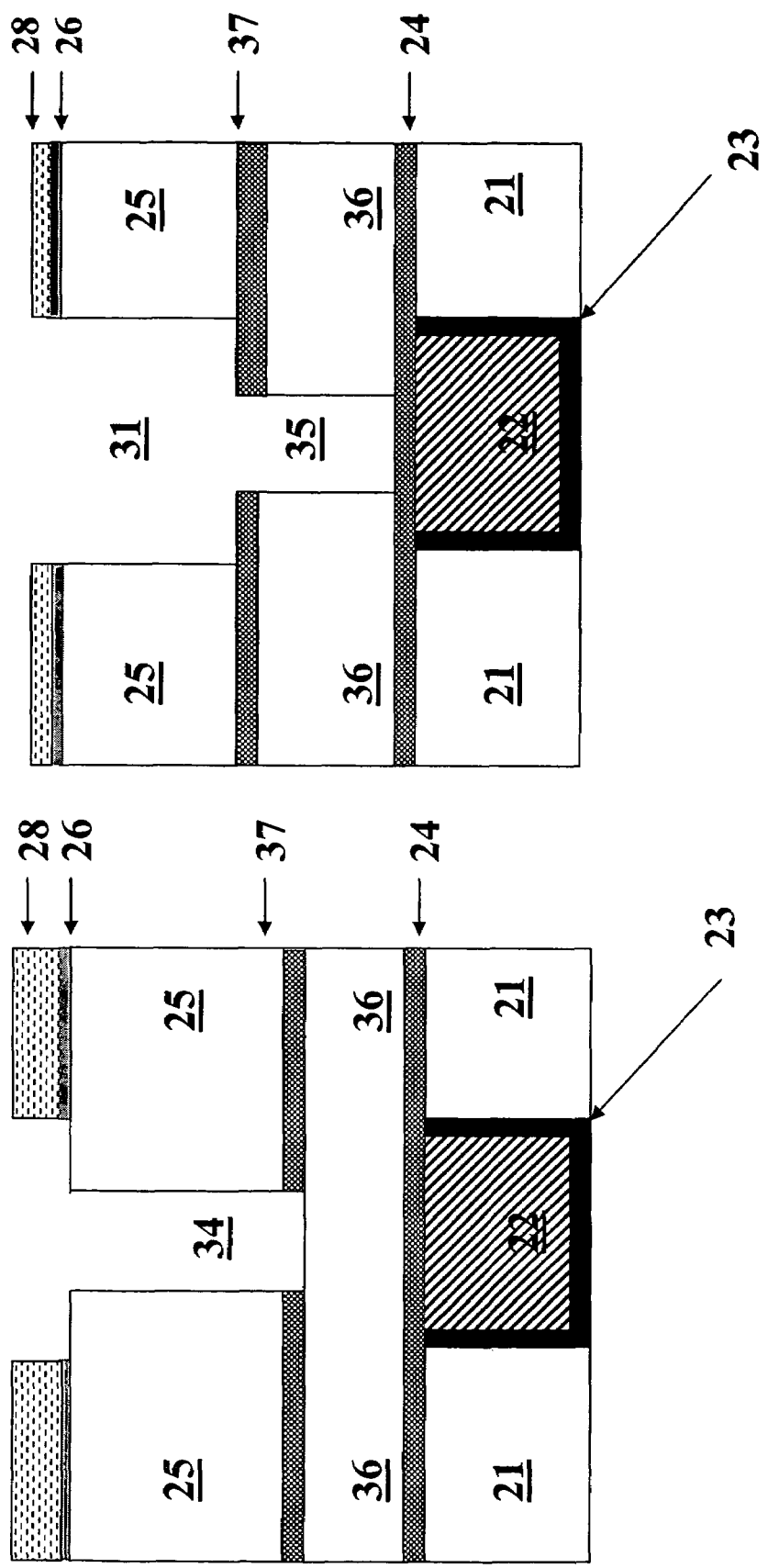
Figure 7L:
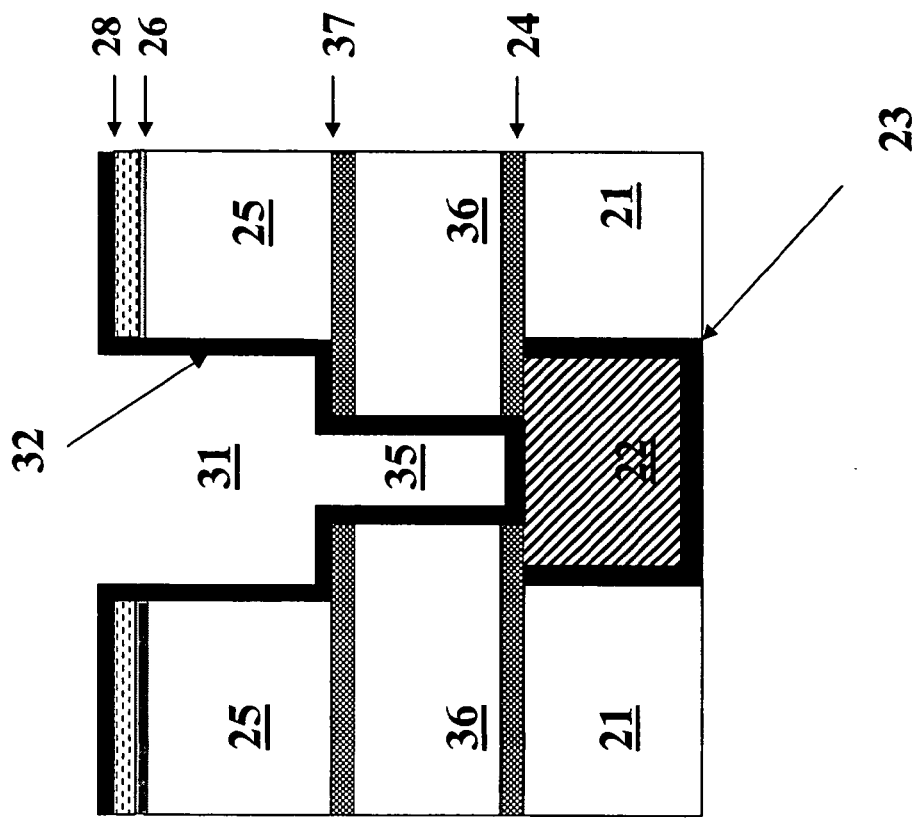
Figure 7K:
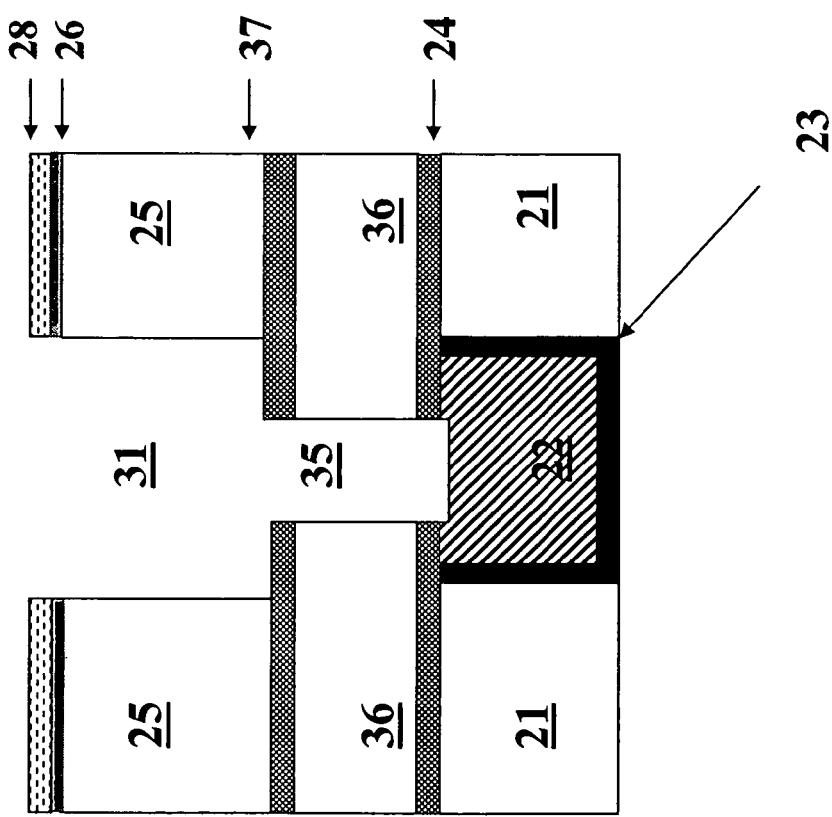
Figure 7M:
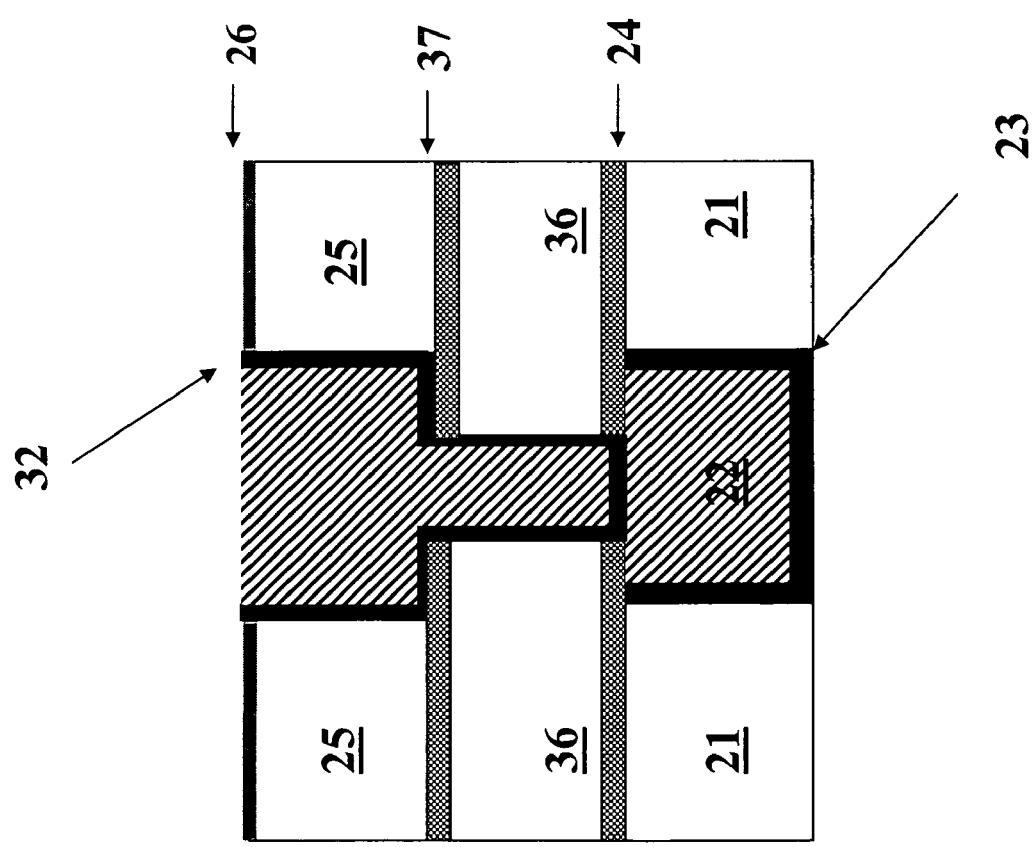

Alternatively to the method described above and also preferred, the etching of the second opening or "trench" in the dielectric material and removal of imaging material(s) (10 and if any 9) are performed simultaneously. The anisotropic etch process used to perform this trench etching is also selective towards the (metal) hardmask used. The etch chemistry of this etch process is further characterized such that it minimizes plasma damage to the dielectric material. Preferably this plasma is an oxygen-free plasma containing hydrogen. Other compounds such as inert compounds may be added to this plasma. Preferably small amounts of $C_xF_y$ compounds are added to this plasma, most preferred this $C_xF_y$ compound is $CF_4$ and most preferred said concentration of $CF_4$ is 5 sccm. This alternative process flow is schematically shown in FIG. 6. The removal of the gap filling material 7 in this process flow can be performed before or during the anisotropical dry-etch process for trench etching.

Dual Damascene Patterning Method Based on Partial-via-First Approach with

Alternatively to the full-via-first approach, a method for patterning of a dual damascene structure based on a partial-via-first approach is also provided and is described below and illustrated in FIGS. 7A-7M. The method is characterized in eliminating photoresist poisoning during trench patterning. The method is further characterized in avoiding or at least minimizing plasma damage to the dielectric material during trench etching (and remaining part of the via).

Preferably the starting point is a substrate comprising a patterned structure.

Said patterned structure comprises a copper pattern 22 or structure such as trenches that are developed in the dielectric layer 21, and a copper diffusion barrier layer 23.

The dielectric material 21 is preferably a low-k material and more preferably a silicon-containing low-k material. Examples of these silicon containing low-k materials are CVD (Chemical Vapor Deposition) type low-k material such as (hydrogenated) silicon-oxy-carbide materials (SiCO(H)) such as ®Black Diamond and ®Aurora.

The patterned structure is preferably a single damascene structure, also referred to as Metal 1.

A stack of layers comprising at least one dielectric etchstop layer 24 (also referred to as dielectric barrier layer) and at least one layer of dielectric material 25 are then deposited on said substrate.

Preferably the dielectric etchstop layer 24 is a SiC(N) layer, to be used as an etch stop layer in further processing steps. Other examples of dielectric etchstop layers include TEOS oxide, silane oxide, and $Si_3N_4$.

Preferably the dielectric material 25 is a low-k material and more preferably a CVD low-k material. Examples of these CVD low-k materials are commercially available materials such as ®Black Diamond, ®Aurora, etc.

As presented on FIGS. 7A-7M, the stack of layers preferably further comprises a layer of dielectric material 36 (also referred to as embedded dielectric layer 36) deposited on said dielectric etchstop layer 24, and a second dielectric barrier 37, also referred to as intermediate dielectric barrier layer 37, deposited on said embedded dielectric layer 36.

Said dielectric layer 25 is then deposited on the intermediate dielectric barrier layer 37.

Dielectric material 25 and embedded dielectric material 36 are preferably the same materials.

An optional capping layer 26 can be deposited above dielectric layer 25, this capping layer may be formed of oxide-type materials such as TEOS-oxide and silane-oxide or nitride-type materials such as SiC(N).

Then a hole, more specifically a "partial" via hole 34, is formed in dielectric layer 25 by using conventional patterning techniques making use of photolithography followed by an anisotropic dry etch process to transfer the pattern in the photoresist layer to the capping layer 26 and dielectric layer 25 (not shown).

The intermediate dielectric barrier layer 37 is used as an etch stop layer during the anisotropic dry etching to create a "partial" via hole 34.

A conventional strip process combined with (wet) cleaning to make sure that no residues are left is then used to remove remaining photoresist and etching residues.

A gap filling material 27 is then deposited in the partial via hole 34 such that at least a complete filling of the hole is achieved.

Preferably the gap filling material 27 is an organic spin-on material such as a common used BARC (Bottom Anti-Reflective Coating) material, etc (as described earlier).

The overburden of the gap filling material 27 is then removed such that its level equals the level of the capping layer 26.

The removal of the overburden of the gap filling material 27 is preferably done by a dry-etch process, also referred to as "etchback".

Subsequently a diffusion barrier layer 28 to eliminate photoresist poisoning in further processing is deposited. The diffusion barrier layer 28 is a hardmask layer, more preferred a metal hardmask layer. Examples of these metal hardmask layers are TaN, TiN, Ta, TaSiN, TiSiN, TiW, and WN.

Imaging material(s) or photosensitive layer(s) (photoresist layer(s) 30 and if any anti-reflective coating 29) are then deposited and a pattern to define the trench over the via is transferred to the imaging material(s).

The imaging material(s) can consist of at least one photoresist layer 30 and optionally of at least one anti-reflective coating 29 (e.g. a Bottom Anti-Reflective Coating or BARC). Preferably, said imaging materials consist of at least one photoresist layer 30 and of at least one anti-reflective coating 29 (e.g. a Bottom Anti-Reflective Coating or BARC).

After the hardmask layer 28 and, possibly also the capping layer 26 are opened, the imaging material(s) and gap filling material 27 are removed by means of a stripping.

The stripping process can be e.g. by means of a $SF_6/O_2$ dry strip plasma.

Preferably the removal (strip) of imaging material(s) (photoresist layer(s) 30 and if any anti-reflective coating 29) and gap filling material 27 in the via are performed simultaneously.

Complete removal of the gap filling material 27 and imaging material(s) prior to the dry etching of the trench over the via avoids a first cause of possible sidewall damage of the trench.

To etch the second opening 31 or "trench" in the dielectric material 25 an anisotropic etch process which is selective towards the hardmask is used and preferably the intermediate dielectric barrier layer 37 is used as etch stop layer.

Simultaneously with the trench etching the partial via is further patterned such that a complete via is obtained making use of the dielectric etchstop layer 24 as etch stop layer for the via.

The dry-etch process used to pattern the trench 31 in dielectric layer 25 and to pattern a complete via 35 in the embedded dielectric layer 36 is further characterized as a selective etching process towards a metal hardmask layer 28.

The etch chemistry of this etch process is further characterized such that it avoids or at least minimizes plasma damage to the dielectric material 25.

Preferably this plasma is an oxygen-free plasma containing fluorocarbon compounds ($C_xH_yF_z$ compounds), more preferred the $C_xH_yF_z$ compound is $C_4F_8$.

The etch plasma further contains nitrogen and may contain inert compounds such as argon, etc.

A Cu diffusion barrier layer is deposited in the trench and via opening to avoid migration of copper in the surrounding dielectric (low-k).

Common used copper diffusion barrier layers such as Ta(N), Ti(N), WNC, etc., can be used here.

Subsequently the trench 31 and via 35 is electroplated with copper.

The overburden of copper, overburden of copper diffusion barrier layer and remaining part of the (metal) hardmask layer 28 is then removed by means of chemical mechanical polishing.

Alternatively to the method described above and also preferred, the overburden of the gap filling material 27 is removed such that its level equals the level of the capping layer 26 by means of Chemical Mechanical Polishing (CMP).

Alternatively to the method described above and also preferred, the removal (strip) of the imaging layer(s) (photoresist and if any BARC) is performed prior to the removal of the gap filling material (depending on type and composition of gap filling material).

Alternatively to the method described above and also preferred, the etching of the second opening or trench 31 in the dielectric material 25 (etching the complete via 35 included) and removal of imaging material(s) (layer(s) 30 and if any 29, referred to as photoresist and BARC) are performed simultaneously. The anisotropic etch process used to perform this trench etching is also selective towards the (metal) hardmask used. The etch chemistry of this etch process is further characterized such that it reduces plasma damage to the dielectric material. Preferably this plasma is an oxygen-free plasma containing hydrogen. Other compounds such as inert compounds can be added to this plasma. Preferably, said inert compound is nitrogen. Preferably fluorocarbon compounds ($C_xF_y$ compounds) are added to the plasma. More preferably, said $C_xF_y$ compound is $CF_4$. Preferably, $CF_4$ is added at a concentration of (about) 5 sccm.

The removal of the gap filling material 27 in this process flow can be performed simultaneously or before the anisotropical dry-etch process for trench etching depending on the material properties of this gap filling material.

Alternatively to the methods described above and also preferred, the etching of the second opening or trench 31 in the dielectric material 25 is a time-etch process instead of an etch process stopping on an etch stop layer. In that case there is no need for an embedded dielectric layer 36 and no need for an intermediate etch stop layer 37 (or second dielectric barrier layer).

EXAMPLE

Example 1

Processing a Dual Damascene Structure on a Substrate Avoiding Resist Poisoning and Reducing Plasma Damage to the Side Walls of the Trench The method, based on the process flow described, is illustrated in this example.

The patterning of the trench (second hole) was done with a hardmask selective etch plasma comprising $C_4F_8$ without oxygen to avoid possible side wall damage of the trench during patterning.

The resist was stripped before the patterning of the trenches.

The dual damascene stack consisted of 30 nm SiC, 340 nm SiOC (k-value~3.0) and a 13 nm oxide cap. The via photo, with 100 nm target dimension, was exposed using a 20 nm thick BARC layer and 220 nm resist. Minimum via pitch was 200 nm.

Figure 8:
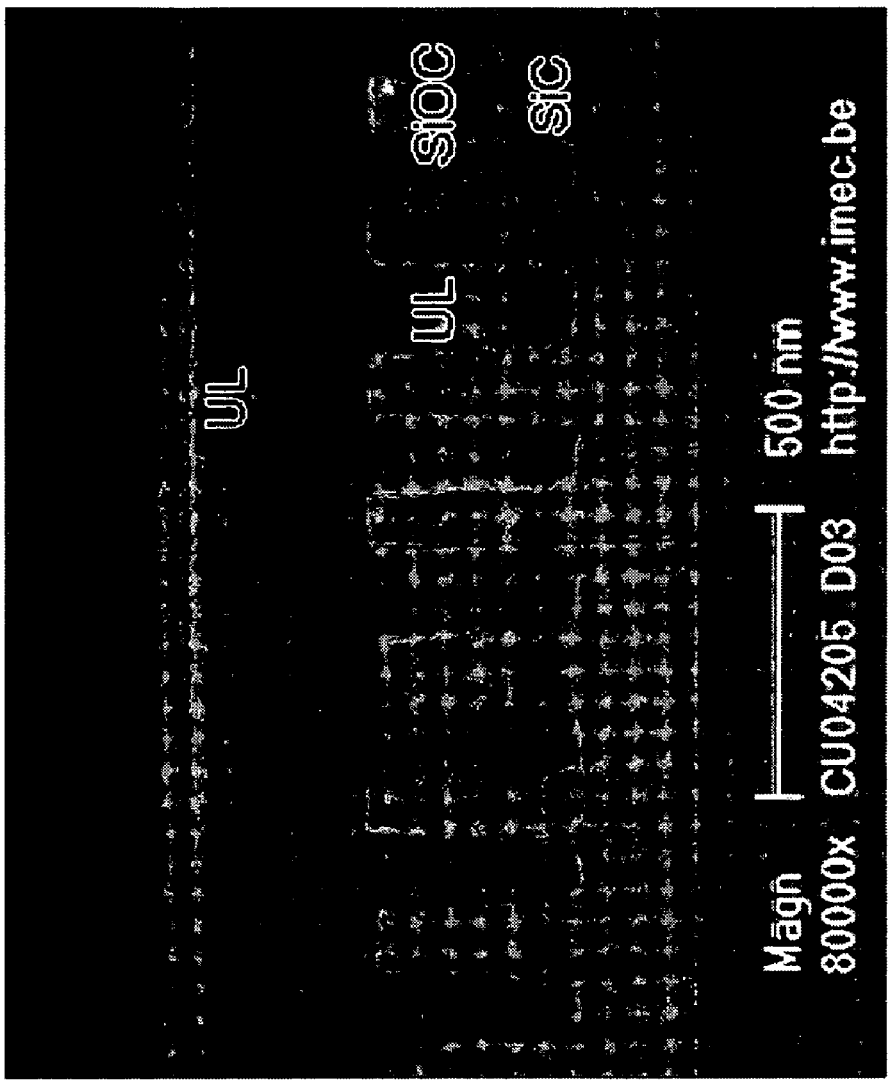
FIG. 8 illustrates a cross-section SEM showing filling of 100 nm size vias etched in a SiOC material after filling with 400 nm UL.

The via holes, including the SiC bottom layer opening, were etched as follows: 10 sec. BARC opening in $CF_4/O_2$; 15 sec. via etching (step 1) in $Ar/O_2/C_4F_8$; 20 sec. via etching (step 2) in $Ar/N_2/C_4F_8/CH_2F_2$; and 10 sec. resist strip in $O_2/CF_4$ The vias were filled using 400 nm thick UL (bottom layer of the 193 nm version of the TIS2000 bilayer as commercially available from Fujifilm Electronic Materials). As can be concluded from FIG. 8 good filling without voids was obtained.

Figure 9:
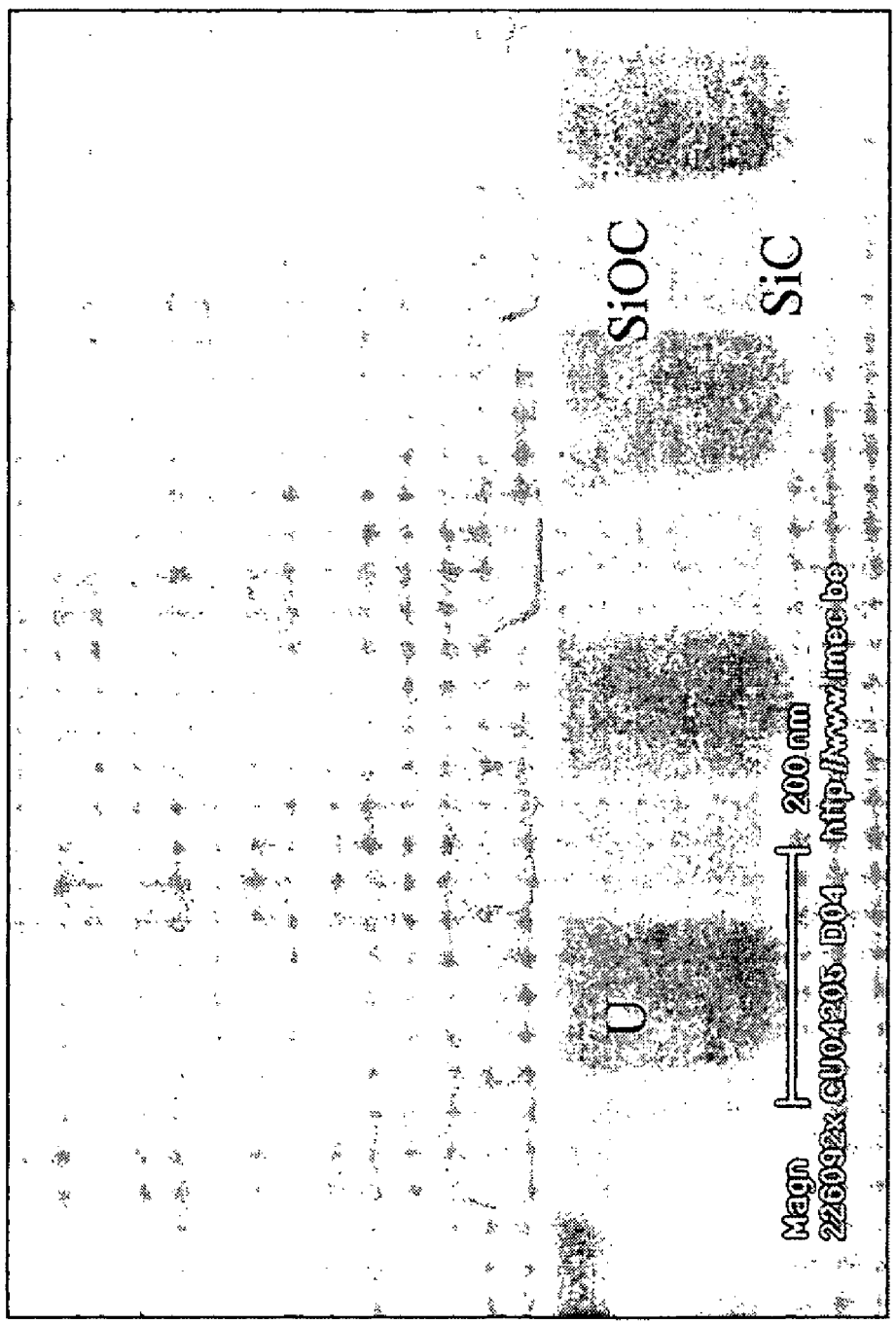
FIG. 9 illustrates a tilted top-view of the planarized vias after the UL etchback step.

After filling, the vias were planarized using a 30" UL etchback step in an $O_2/SO_2/CH_3F$ plasma. As shown in FIG. 9 the remaining topography is limited to ~50 nm on the most dense via structures, which are most critical.

For the TaN metal hardmask deposition on these UL-planarized structures, it is important to stay below the UL bake temperature (215° C.). Before deposition of a 50 nm TaN, the wafers were degassed at 150° C. for 10 min. The TaN deposition was done using 100° C. chuck temperature and the anticipated temperature increase due to Ar bombardment is expected to be less than 50° C.

After TaN capping, the wafers were inspected in top view SEM and no delamination or other apparent problems were observed.

After planarization however sufficient topography was left on the 2 mm wide Athena alignment markers (ASML/1100 stepper was used for exposure), so that alignment of the trench photo on the (non-transparent) TaN hard mask was possible without an additional clear-out of the alignment marks.

Figure 10:
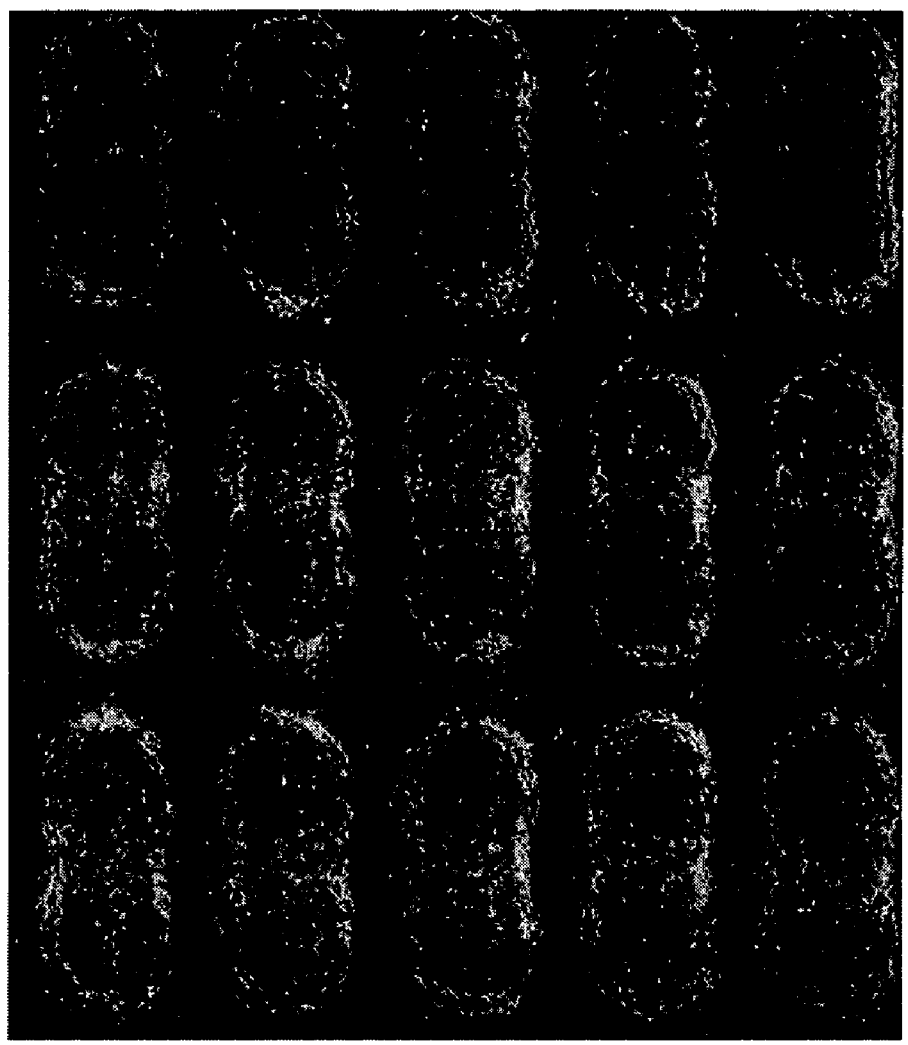
FIG. 10 shows a top-view SEM picture after trench (second hole) photolithographic patterning.
Figure 11:
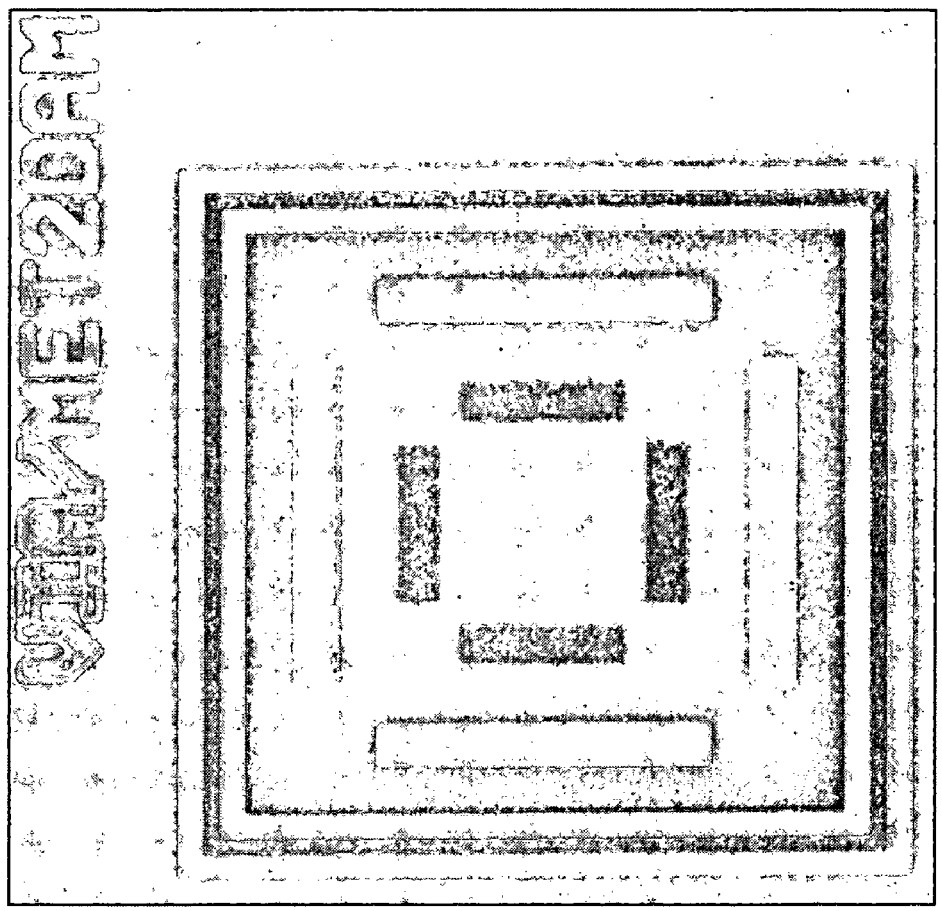
FIG. 11 shows that good Metal 2—Via alignment was obtained without metal clear-out.

The trench photo on the metal hard mask was exposed using 35 nm thick BARC and 220 nm resist. The exposure was targeted to via links with 120/240 nm width/pitch as illustrated in FIG. 10. The mean +3 s trench-to-via misalignment error was ~25 nm, which is well below the spec limit of 50 nm. The good alignment accuracy is further illustrated in FIG. 11.

In order to minimize the low-k field and sidewall damage caused by (oxygen-containing) etch and strip plasmas, a metal-hard-mask-based trench patterning sequence was used, as follows: 60 sec. resist treatment in HBr; 13 sec. BARC opening in $HBr/O_2$; 35 sec. TaN metal hard mask opening in $Cl_2$; 25 sec. resist strip in $SF_6/O_2$; and 40 sec. SiOC etching in $Ar/C_4F_8/N_2$ (oxygen-free).

Figure 12:
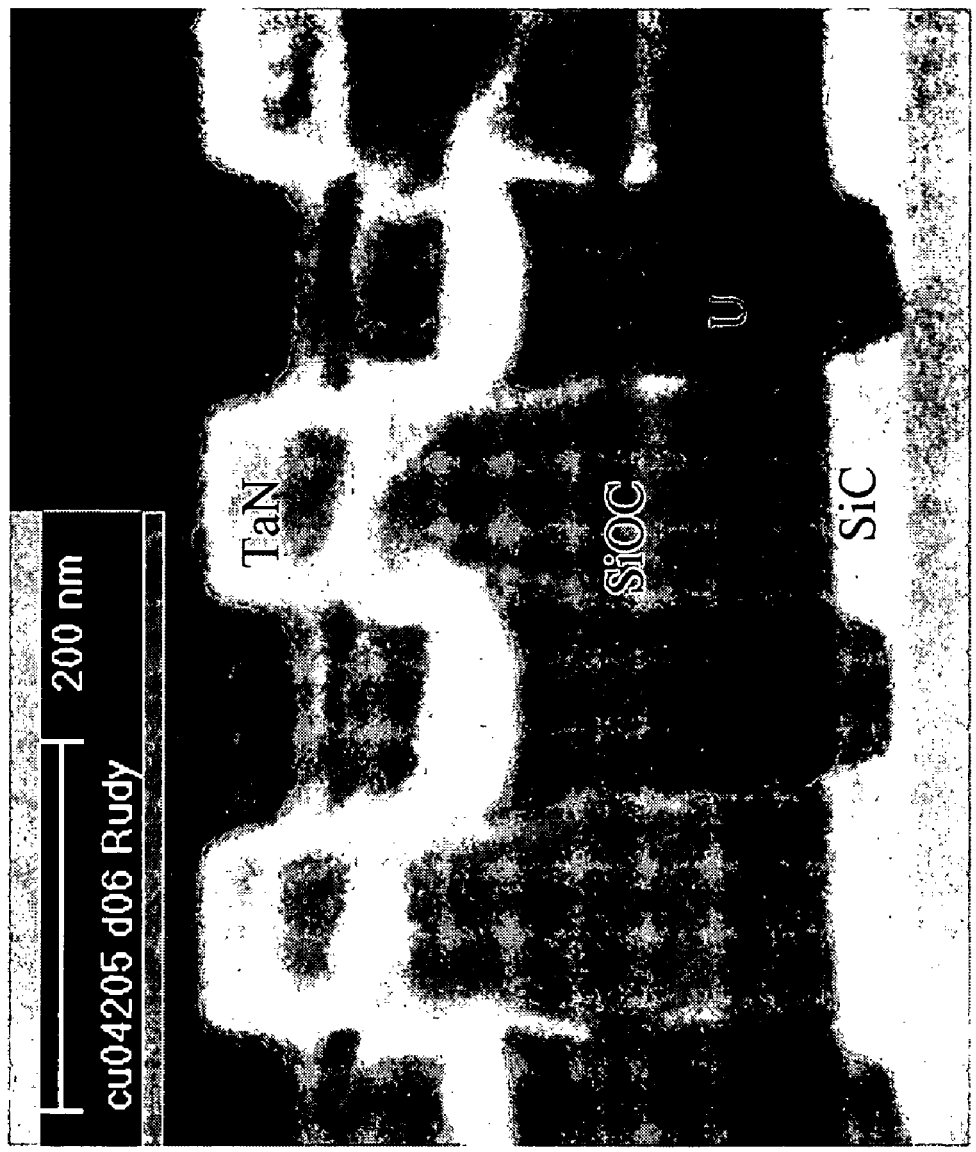
FIG. 12 shows a cross-section SEM photo after metal-hard-mask opening and strip.

FIG. 12 shows a SEM cross-section after metal hard mask opening and resist strip. About 75% of the via plugs remain filled with UL at this stage.

Figure 13:
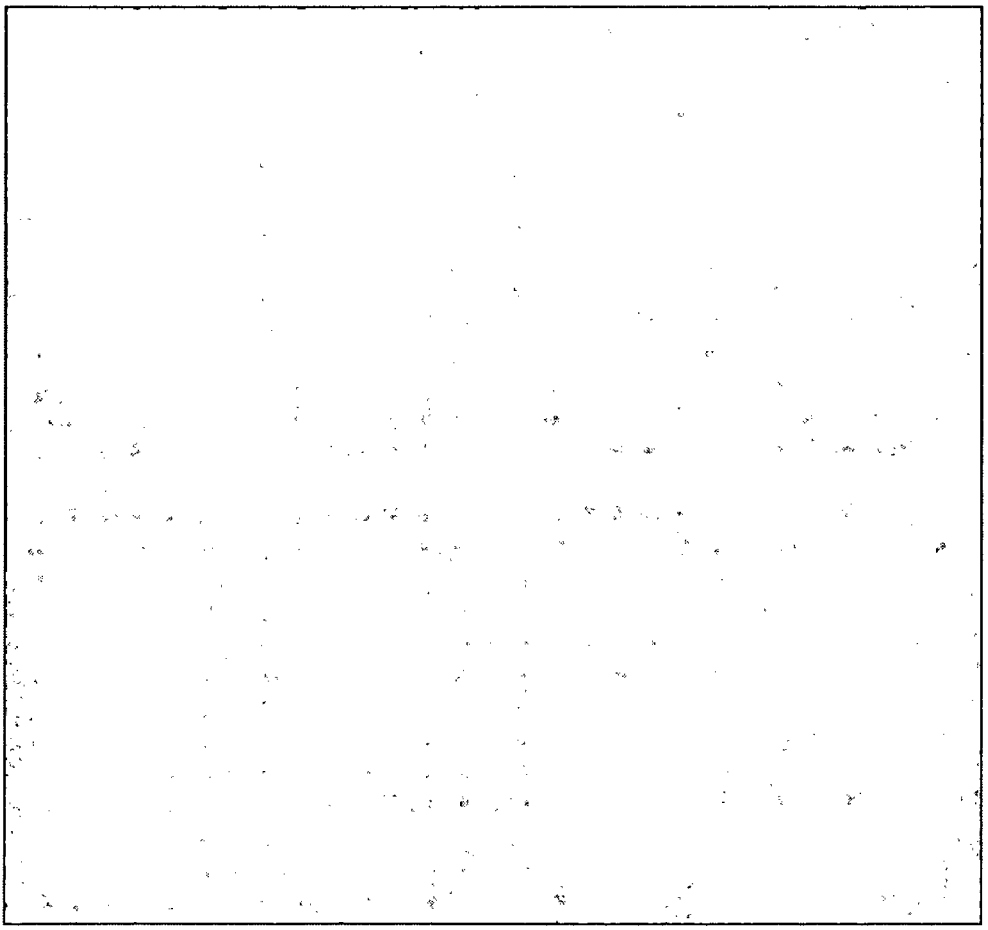
FIG. 13 shows a top-view SEM picture after full dual damascene patterning.

After completing the full dual damascene etch sequence as described above, top view SEM (as shown in FIG. 13) was done showing well-behaving dual damascene profiles. The TaN cap will be removed during the CMP process.

In conclusion, an alternative dual damascene patterning approach was achieved with the following advantages: resist poisoning is avoided because the TaN hard mask blocks all amines; the trench etch is metal-hard-mask-based (selective), hereby avoiding damage of the low-k by the strip plasma, together with more freedom for the (oxygen-free) trench chemistry selection—in this way it was shown that the effective k-value after patterning is very close to the pristine one; and a metal clear-out for the trench photo is avoided All references cited herein, including but not limited to published and unpublished applications, patents, and literature references, are incorporated herein by reference in their entirety and are hereby made a part of this specification. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification are to be understood as being modified in all instances by the term "about." Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention.

What is claimed is:

1. A method for patterning a dual damascene structure, the method comprising the steps of:
    depositing a dielectric layer on a substrate;
    depositing a capping layer on the dielectric layer;
    etching a first hole in the capping layer and the dielectric layer;
    depositing a gap filling material such that the first hole is completely filled;
    removing a part of the gap filling material such that the gap filling material is level with the capping layer;
    depositing a metal hardmask layer on the capping layer;
    depositing at least one imaging material on the metal hardmask layer;
    forming at least one first pattern in the imaging material;
    transferring the first pattern to the metal hardmask layer;
    removing the imaging material;
    removing all remaining gap filling material; and thereafter
    etching a second hole over the first hole using an oxygen-free plasma containing fluorocarbon compound as an etchant, whereby a dual damascene structure is patterned.

2. The method according to claim 1, wherein the first hole is a via and the second hole is a trench.

3. The method according to claim 1, wherein the substrate further comprises a patterned structure.

4. The method according to claim 3, wherein the patterned structure is a single damascene interconnect structure.

5. The method according to claim 1, further comprising the step of depositing a dielectric barrier layer upon the substrate, wherein the step is conducted before the step of depositing the dielectric layer.

6. The method according to claim 1, wherein the step of removing a part of the gap filling material is performed by a process selected from a dry etch process and a chemical mechanical polishing process.

7. The method according to claim 1, wherein the step of removing all remaining gap filling material is conducted before the step of removing the imaging material.

8. The method according to claim 1, further comprising steps of depositing a copper diffusion barrier layer on sidewalls of the first hole and the second hole, and plating copper in the first hole and the second hole.

9. The method according to claim 1, further comprising steps of depositing a copper diffusion barrier layer and a copper seed layer on sidewalls of the first hole and the second hole, and plating copper in the first hole and the second hole, whereby an overburden of copper is deposited.

10. The method according to claim 9, further comprising a step of removing the overburden of copper, the copper barrier layer, the copper seed layer, and the metal hardmask layer that is underneath the overburden of copper by chemical mechanical polishing.

11. The method according to claim 1, wherein the dielectric material is a silicon-containing dielectric material having pores.

12. The method according to claim 11, wherein the dielectric material is a SiCO(H) material.

13. The method according to claim 1, wherein the gap filling material comprises at least one organic material.

14. The method according to claim 13, wherein the organic material is selected from the group consisting of bottom anti-reflective coating material, polyarylsulfones, polyhydroxystyrene-based derivatives, polyimides, polyethers, polyarylenesulfides, polycarbonates, epoxies, epoxyacrylates, polyarylenes, polyarylenevinylenes, polyvinylcarbazole, cycloolefins, and polyesters.

15. The method according to claim 14, wherein the polyether is a polyarylene ether.

16. The method according to claim 14, wherein the polyarylene is a polyphenylene.

17. The method according to claim 14, wherein the polyarylenevinylene is a polyphenylenevinylene.

18. The method according to claim 1, wherein the metal hardmask layer comprises a material selected from the group consisting of TaN, TiN, TaSiN, TiSiN, TiW, and WN.

19. The method according to claim 1, wherein the fluorocarbon compound is $C_4F_8$.

20. The method according to claim 1, wherein the oxygen-free plasma further comprises nitrogen or an inert compound.

21. The method of claim 20, wherein the inert compound is argon.

22. The method according to claim 1, wherein the steps of removing the imaging material and of etching the second hole are performed in a single step.

23. A full-via-first patterning method comprising the method of claim 1.

24. A partial-via-first patterning method comprising the method of claim 1.

25. A method for patterning a dual damascene structure, the method comprising the steps of:
depositing a dielectric layer on a substrate;
etching a first hole in the dielectric layer;
depositing a gap filling material such that the first hole is completely filled;
removing a part of the gap filling material such that the gap filling material is level with the dielectric layer;
depositing a metal hardmask layer on the dielectric layer;
depositing at least one imaging material on the metal hardmask layer;
forming at least one first pattern in the imaging material;
transferring the first pattern to the metal hardmask layer;
removing the imaging material;
removing all remaining gap filling material; and thereafter
etching a second hole over the first hole using an oxygen-free plasma containing fluorocarbon compound as an etchant, whereby a dual damascene structure is patterned.

* * * * *

UNITED STATES PATENT AND TRADEMARK OFFICE
CERTIFICATE OF CORRECTION

PATENT NO. : 7,611,986 B2  Page 1 of 1
APPLICATION NO. : 11/400852
DATED : November 3, 2009
INVENTOR(S) : Van Olmen et al.

It is certified that error appears in the above-identified patent and that said Letters Patent is hereby corrected as shown below:

| Issued Patent | | 1. Description of Error |
|---|---|---|
| Column | Line | |
| 10 | 33 | Change "TIS2000" to --TIS2000®--. |
| 11 | 4 | Change "Alteratively," to --Alternatively,--. |
| 14 | 57 | After "$O_2/CF_4$" insert --.--. |
| 15 | 19 (Approx.) | Change "+3 s" to --+3s--. |
| 15 | 45 (Approx.) | After "avoided" insert --.--. |

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,611,986 B2
APPLICATION NO. : 11/400852
DATED : November 3, 2009
INVENTOR(S) : Olmen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 505 days.

Signed and Sealed this

Nineteenth Day of October, 2010

David J. Kappos
*Director of the United States Patent and Trademark Office*